United States Patent
Hayashi

(10) Patent No.: US 10,269,832 B2
(45) Date of Patent: Apr. 23, 2019

(54) THIN FILM TRANSISTOR SUBSTRATE, METHOD FOR MANUFACTURING THIN FILM TRANSISTOR SUBSTRATE, AND DISPLAY PANEL

(71) Applicant: JOLED INC., Tokyo (JP)

(72) Inventor: Hiroshi Hayashi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/517,509

(22) PCT Filed: Sep. 30, 2015

(86) PCT No.: PCT/JP2015/004987
§ 371 (c)(1),
(2) Date: Apr. 6, 2017

(87) PCT Pub. No.: WO2016/056204
PCT Pub. Date: Apr. 14, 2016

(65) Prior Publication Data
US 2017/0309649 A1    Oct. 26, 2017

(30) Foreign Application Priority Data
Oct. 10, 2014  (JP) .................................. 2014-209367

(51) Int. Cl.
*H01L 27/12* (2006.01)
*G09F 9/30* (2006.01)
(Continued)

(52) U.S. Cl.
CPC ............ *H01L 27/1225* (2013.01); *G09F 9/30* (2013.01); *G09F 9/33* (2013.01); *H01L 21/8234* (2013.01);
(Continued)

(58) Field of Classification Search
CPC .......................... H01L 27/1225; H01L 27/127
See application file for complete search history.

(56) References Cited

U.S. PATENT DOCUMENTS

2009/0230392 A1   9/2009  Takahara
2010/0006834 A1   1/2010  Kim et al.
(Continued)

FOREIGN PATENT DOCUMENTS

JP  2009-224595 A  10/2009
JP  2010-21555 A   1/2010
(Continued)

OTHER PUBLICATIONS

International Search Report in International Patent Application No. PCT/JP2015/004987, dated Dec. 15, 2015.
(Continued)

*Primary Examiner* — Trang Q Tran
(74) *Attorney, Agent, or Firm* — Hauptman Ham, LLP

(57) ABSTRACT

A thin film transistor substrate includes: a substrate; and a first thin film transistor and a second thin film transistor that are disposed on the substrate. The first thin film transistor includes a first gate electrode and a first oxide semiconductor layer that is used as a channel. The second thin film transistor includes a second gate electrode and a second oxide semiconductor layer that is used as a channel. The first oxide semiconductor layer includes a first oxide semiconductor material that is different in mobility from a second oxide semiconductor material that the second oxide semiconductor layer includes.

15 Claims, 15 Drawing Sheets

(51) Int. Cl.

| | | |
|---|---|---|
| H01L 21/8234 | (2006.01) | |
| H01L 27/08 | (2006.01) | |
| H01L 27/088 | (2006.01) | |
| H01L 51/50 | (2006.01) | |
| G09F 9/33 | (2006.01) | |
| H01L 29/423 | (2006.01) | |
| H01L 29/49 | (2006.01) | |
| H01L 29/786 | (2006.01) | |
| H01L 27/32 | (2006.01) | |

(52) U.S. Cl.
CPC ............ *H01L 27/08* (2013.01); *H01L 27/088* (2013.01); *H01L 27/124* (2013.01); *H01L 27/127* (2013.01); *H01L 27/1222* (2013.01); *H01L 27/1229* (2013.01); *H01L 29/42384* (2013.01); *H01L 29/4908* (2013.01); *H01L 29/78645* (2013.01); *H01L 29/78696* (2013.01); *H01L 51/50* (2013.01); *H01L 27/3262* (2013.01)

(56) References Cited

U.S. PATENT DOCUMENTS

| | | | |
|---|---|---|---|
| 2010/0163868 A1* | 7/2010 | Yamazaki | ........... H01L 27/1225 257/43 |
| 2011/0108837 A1 | 5/2011 | Yamazaki et al. | |
| 2011/0124138 A1 | 5/2011 | Takahara | |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2011/0215319 A1 | 9/2011 | Yamazaki et al. | |
| 2012/0286264 A1 | 11/2012 | Suzuki et al. | |
| 2012/0287027 A1 | 11/2012 | Koayama | |
| 2014/0001465 A1* | 1/2014 | Yamazaki | ......... H01L 29/66969 257/43 |
| 2014/0131704 A1 | 5/2014 | Yamazaki et al. | |
| 2014/0231798 A1 | 8/2014 | Ono et al. | |
| 2015/0333089 A1 | 11/2015 | Yamazaki et al. | |
| 2016/0005876 A1 | 1/2016 | Yamazaki et al. | |

FOREIGN PATENT DOCUMENTS

| | | |
|---|---|---|
| JP | 2010-171404 A | 8/2010 |
| JP | 2011-119718 A | 6/2011 |
| JP | 2012-256034 A | 12/2012 |
| JP | 2013-41945 A | 2/2013 |
| WO | 2011/142088 A1 | 11/2011 |

OTHER PUBLICATIONS

T. Kaitoh et al, "SELAX Technology for Poly-Si TFTs Integrated with Amorphos-Si TFTs", IDW Dig., 2007, p. 481-484.

T. Okabe et al, "Microcrystalline Silicon Thin Film Transistors by Excimer Laser Annealing for Large-sized TFT-LCDs", IDW Dig., 2009, p. 257-260.

Office Action in JP Application No. 2016-552816, dated Jun. 12, 2018, 4pp.

* cited by examiner

High-mobility region | Low-mobility region (a)

(b)

(c)

(d)

(e)

(f)

THIN FILM TRANSISTOR SUBSTRATE, METHOD FOR MANUFACTURING THIN FILM TRANSISTOR SUBSTRATE, AND DISPLAY PANEL

RELATED APPLICATIONS

The present application is a National Phase of International Application Number PCT/JP2015/004987, filed Sep. 30, 2015, which claims priority to Japanese Application Number 2014-209367, filed Oct. 10, 2014.

TECHNICAL FIELD

The present disclosure relates to a thin film transistor substrate provided with a thin film transistor (TFT), a method for manufacturing the thin film transistor substrate, and a display panel provided with the thin film transistor substrate.

BACKGROUND ART

Thin film transistors have been used as drive elements or switching elements in active matrix display apparatuses, such as liquid crystal display apparatuses that include liquid crystals or organic light-emitting diode (OLED) display apparatuses that include organic electroluminescence (EL).

Moreover, such a display apparatus includes a thin film transistor substrate which has, on one and the same substrate, both a display element that includes pixels arranged in a matrix and a drive circuit that drives the display element. Thin film transistors are used in the drive circuit and the pixels of the display element in the thin film transistor substrate. Here, the required characteristics are different between the thin film transistor used in the drive circuit and the thin film transistor used for driving a light-emitting element in the pixel. To be more specific, the thin film transistor used in the drive circuit is required to have a high carrier mobility in a channel to enable high speed drive of the display element. On the other hand, the thin film transistor used for driving the light-emitting element in the pixel is required to have characteristics that enables current supply corresponding to the light-emitting element. In view of this, a thin film transistor substrate has been proposed which is provided with: a thin film transistor that has a channel formed from low-temperature polysilicon and is used in a drive circuit; and a thin film transistor that has a channel formed from amorphous silicon and is used in a pixel (Non Patent Literature [NPL] 1).

CITATION LIST

Non Patent Literature

[NPL 1] T. Kaitoh, T. Miyazawa, H. Miyake, T. Noda, T. Sakai, Y. Owaku, and T. Saitoh, IDW Dig., 2007, p. 481

SUMMARY OF INVENTION

Technical Problem

To change the pixel size of the thin film transistor substrate disclosed in NPL 1, the carrier mobility of amorphous silicon used in the pixel corresponding to the pixel size and the current to be supplied to the light-emitting element needs to be adjusted. Such a mobility adjustment can be made through heat treatment. However, part of amorphous silicon may be crystallized in some cases. Here, the mobility is significantly different between amorphous silicon and such partially crystallized silicon. Thus, with the adjustment made through the heat treatment to amorphous silicon in each pixel of the thin film transistor substrate disclosed in NPL 1, variations may be caused in mobility. This, in turn, causes variations in luminance among the pixels.

The present disclosure has an object to provide a thin film transistor substrate and so forth that can adjust the mobility extensively while suppressing variations in mobility when the thin film transistor substrate is provided with a plurality of thin film transistors in each of which a semiconductor layer used as a channel has a different mobility.

Solution to Problem

To achieve the aforementioned object, a thin film transistor substrate according to an aspect includes: a substrate; and a first thin film transistor and a second thin film transistor that are disposed on the substrate, wherein the first thin film transistor includes a first gate electrode and a first oxide semiconductor layer that is used as a channel, the second thin film transistor includes a second gate electrode and a second oxide semiconductor layer that is used as a channel, and the first oxide semiconductor layer comprises a first oxide semiconductor material that is different in mobility from a second oxide semiconductor material that the second oxide semiconductor layer comprises.

Advantageous Effects of Invention

The thin film transistor substrate can be achieved which is provided with a plurality of thin film transistors in each of which a semiconductor layer used as a channel has a different mobility. Moreover, the mobility of the semiconductor layer in the thin film transistor substrate can be adjusted extensively with accuracy.

DESCRIPTION OF EMBODIMENTS

Figure 1:
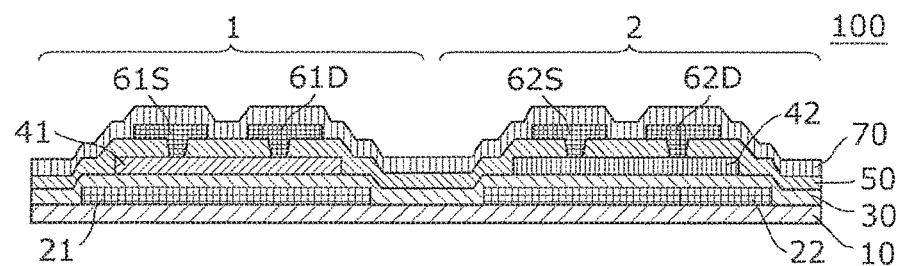
FIG. 1 is a cross-sectional view of a thin film transistor substrate according to Embodiment 1.

Hereinafter, exemplary embodiments according to the present disclosure are described with reference to the accompanying drawings. It should be noted that each of the exemplary embodiments below describes only a preferred specific example according to the present disclosure. Therefore, the numerical values, shapes, materials, structural elements, the arrangement and connection of the structural elements, processes (steps), the processing order of the steps, and so forth described in the following exemplary embodiments are merely examples, and are not intended to limit the present disclosure. Thus, among the structural elements in the following exemplary embodiments, structural elements that are not recited in any one of the independent claims indicating top concepts according to the present disclosure are described as arbitrary structural elements.

Note that the accompanying drawings are only schematic diagrams and are not necessarily precise representations. Note also that, in all the drawings, the same reference numerals are given to the substantially same structural elements and redundant description thereof shall be omitted or simplified.

Furthermore, the terms "above" and "below" used in the present description do not refer to an upward direction (vertically upward) and a downward direction (vertically downward), respectively, in the absolute space recognition. In the present description, these terms are defined by a relative positional relationship based on an order in which layers are laminated in a laminated structure. Moreover, the terms "above" and "below" are used not only in the case where two structural elements are arranged with a space in between and another structural element is interposed between these two structural elements, but also in the case where two structural elements are arranged closely to be in contact with each other.

Embodiment 1

The following describes a thin film transistor substrate 100 and a method for manufacturing the same according to Embodiment 1, with reference to the drawings.

1-1. Configuration of Thin Film Transistor Substrate

Firstly, the configuration of the thin film transistor substrate 100 according to the present embodiment is described, with reference to FIG. 1. FIG. 1 is a cross-sectional view of the thin film transistor substrate 100 according to the present embodiment.

As shown in FIG. 1, the thin film transistor substrate 100 includes: a substrate 10; and a first thin film transistor 1 and a second thin film transistor 2 that are disposed on the substrate 10. Each of the first thin film transistor 1 and the second thin film transistor 2 is a channel-protection bottom-gate TFT in which the top-contact configuration is adopted.

The following is a detailed description of structural elements included in the thin film transistor substrate 100 according to the present embodiment.

The substrate 10 is an insulating substrate that comprises an insulating material. For example, the substrate 10 is a glass substrate that comprises a glass material, such as silica glass, alkali-free glass, or high heat resistant glass.

It should be noted that the substrate 10 is not limited to a glass substrate and may be, for example, a resin substrate that comprises a resin material, such as polyethylene resin, polypropylene resin, or polyimide resin. Furthermore, the substrate 10 may be a flexible substrate, instead of a rigid substrate. The examples of the flexible substrate include a flexible glass substrate and a flexible resin substrate that are in the form of a flexible sheet or a flexible film. For example, the flexible resin substrate may be a single-layer substrate comprising one of, or a multilayer substrate comprising, film materials, such as polyimide, polyethylene terephthalate, and polyethylene naphthalate. Here, an undercoat layer may be formed on the surface of the substrate 10.

The first thin film transistor 1 includes a first gate electrode 21, a gate insulating layer 30, a first oxide semiconductor layer 41, a channel protection layer 50, a first source electrode 61S, a first drain electrode 61D, and a protection layer 70. Moreover, the second thin film transistor 2 includes a second gate electrode 22, the gate insulating layer 30, a second oxide semiconductor layer 42, the channel layer 50, a second source electrode 62S, a second drain electrode 62D, and the protection layer 70.

Each of the first gate electrode 21 and the second gate electrode 22 has a single-layer structure formed from one of, or a multilayer structure formed from, electrically conductive films each comprising an electrically conductive material, such as a metal, or an alloy of the metal, for example. Each of the first gate electrode 21 and the second gate electrode 22 is formed in a predetermined shape and disposed on the substrate 1. Each of the first gate electrode 21 and the second gate electrode 22 has a film thickness of 20 nm to 500 nm, for example.

Examples of the material of the first gate electrode 21 and the second gate electrode 22 include the following: a metal, such as molybdenum, aluminum, copper, tungsten, titanium, manganese, chromium, tantalum, niobium, silver, gold, platinum, palladium, indium, nickel, or neodymium; and a metal alloy (such as molybdenum-tungsten alloy) comprising metals selected from among these metals.

It should be noted that the material of the first gate electrode 21 and the second gate electrode 22 is not limited to these. The following may be used as the material: an electrically conductive metal oxide, such as indium tin oxide (ITO), aluminum-doped zinc oxide (AZO), or gallium-doped zinc oxide (GZO); or an electrically conductive polymer, such as polythiophene or polyacetylene.

The gate insulating layer 30 is disposed between the first gate electrode 21 and the first oxide semiconductor layer 41 as well as between the second gate electrode 22 and the second oxide semiconductor layer 42. In the present embodiment, the gate insulating layer 30 is disposed above the first gate electrode 21 and the second gate electrode 22. For example, the gate insulating layer 30 is formed on the substrate 10 in a manner that the first gate electrode 21 and the second gate electrode 22 are covered. The gate insulating layer 30 has a film thickness of 50 nm to 500 nm, for example.

The gate insulating layer 30 comprises an electrically insulating material. For example, the gate insulating film 30 is a single-layer film comprising one of, or a multilayer film comprising, a silicon oxide film, a silicon nitride film, a silicon oxynitride film, an aluminum oxide film, a tantalum oxide film, and a hafnium oxide film.

The first oxide semiconductor layer 41 is disposed on the gate insulating layer 30 above the first gate electrode 21, and the second oxide semiconductor layer 42 is disposed on the gate insulating layer 30 above the second gate electrode 22. Each of the first oxide semiconductor layer 41 and the second oxide semiconductor layer 42 is formed in a predetermined shape. For example, each of the first oxide semiconductor layer 41 and the second oxide semiconductor layer 42 is formed on the gate insulating layer 30 in the shape of an island. In the present embodiment, the first oxide semiconductor layer 41 and the second oxide semiconductor layer 42 are channels of the first thin film transistor 1 and the second thin film transistor 2, respectively. To be more specific, the first oxide semiconductor layer 41 and the second oxide semiconductor layer 42 are semiconductor layers that have channel regions that are opposite to the first gate electrode 21 and the second gate electrode 22, respectively, with the gate insulating layer 30 being interposed in between. Each of the first oxide semiconductor layer 41 and the second oxide semiconductor layer 42 has a film thickness of 30 nm to 300 nm, for example.

Each of the first oxide semiconductor layer 41 and the second oxide semiconductor layer 42 contains, as a major component, InSiO that is an oxide semiconductor material. Moreover, a first oxide semiconductor material forming the first oxide semiconductor layer 41 is different in carrier mobility from a second oxide semiconductor material forming the second oxide semiconductor layer 42. In the present embodiment, heat treatment is performed on the first oxide semiconductor layer 41 so that the first oxide semiconductor material has a higher mobility than the second oxide semiconductor material. It should be noted that the mobility of the first oxide semiconductor material is not intended to be specifically limiting and may be adjusted to be 10 $cm^2/Vs$ or more, for example. Furthermore, the mobility of the second oxide semiconductor material is not intended to be specifically limiting either and may be adjusted to be less than 10 $cm^2/Vs$, for example.

The channel protection layer 50 is disposed on the first oxide semiconductor layer 41 and the second oxide semiconductor layer 42. To be more specific, the channel protection layer 50 is formed on the gate insulating layer 30 in a manner that the first oxide semiconductor layer 41 and the second oxide semiconductor layer 42 are covered. The channel protection layer 50 has a film thickness of 50 nm to 500, for example.

In the present embodiment, the channel protection layer 50 functions as a protection film that protects the channel regions of the first oxide semiconductor layer 41 and the second oxide semiconductor layer 42. More specifically, the channel protection layer 50 functions as an etch stopper layer that protects the first oxide semiconductor layer 41 and the second oxide semiconductor layer 42 from being etched when the respective source and drain electrodes to be formed above the first oxide semiconductor layer 41 and the second oxide semiconductor layer 42 are patterned by etching. With this, process damage on the back-channel side of each of the oxide semiconductor layers in the bottom-gate TFT can be reduced. Furthermore, the channel protection layer 50 in the present embodiment is an interlayer insulating film formed on the entire surface of the gate insulating layer 30.

The channel protection layer 50 comprises an electrically insulating material. For example, the channel protection layer 50 is a single-layer film comprising one of, or a multilayer film comprising, a silicon oxide film, a silicon nitride film, a silicon oxynitride film, and an aluminum oxide film.

When a silicon oxide film is formed, hydrogen to be caused is less as compared to when a silicon nitride film is formed. Thus, the use of the silicon oxide film as the channel protection layer 50 can suppress performance degradation in the oxide semiconductor layer that may be caused by hydrogen reduction. Moreover, when an aluminum oxide film is formed as the channel protection layer 50, hydrogen and oxygen caused in an upper layer can be blocked by this aluminum oxide film. In view of these points, the channel protection layer 50 may be a three-layer laminated film comprising a silicon oxide film, an aluminum oxide film, and a silicon oxide film.

It should be noted that the examples of the material of the channel protection layer 50 are not limited to the inorganic materials described above and may include a material that contain an organic substance as a major component.

Furthermore, the channel protection layer 50 has opening portions (contact holes) that penetrate the channel protection layer 50 partially. Via these opening portions of the channel protection layer 50, the first oxide semiconductor layer 41 is connected to the first source electrode 61S and the first drain electrode 61D. Similarly, via this opening portions, the second oxide semiconductor layer 42 is connected to the second source electrode 62S and the second drain electrode 62D.

Each of the first source electrode 61S, the first drain electrode 61D, the second source electrode 62S, and the second drain electrode 62D is located at least partially above the channel protection layer 50 and is formed in a predetermined shape to be connected to the corresponding one of the first oxide semiconductor layer 41 and the second oxide semiconductor layer 42. To be more specific, the first source electrode 61S and the first drain electrode 61D are disposed at a distance from each other and opposite to each other on the channel protection layer 50 in a direction horizontal to the substrate 10 (that is, a substrate horizontal direction). In addition, the first source electrode 61S and the first drain electrode 61D are connected to the first oxide semiconductor layer 41 via the opening portions formed in the channel protection layer 50. The second source electrode 62S and the second drain electrode 62D are disposed at a distance from each other and opposite to each other on the channel protection layer 50 in the direction horizontal to the substrate 10 (that is, the substrate horizontal direction). In addition, the second source electrode 62S and the second drain electrode 62D are connected to the second oxide semiconductor layer 42 via the opening portions formed in the channel protection layer 50. Each of the source and drain electrodes formed on the channel protection layer 50 has a film thickness of 100 nm to 500 nm, for example.

Each of the first source electrode 61S, the first drain electrode 61D, the second source electrode 62S, and the second drain electrode 62D has a single-layer structure formed from one of, or a multilayer structure formed from, electrically conductive films each comprising, for example, an electrically conductive material or an alloy. Examples of the material of the source and drain electrodes include aluminum, tantalum, molybdenum, tungsten, silver, copper, titanium, and chromium. As an example, each of the source and drain electrodes has a single-layer structure formed from a molybdenum-tungsten film (MoW film).

The protection layer 70 is an insulating film disposed on each of the source and drain electrodes. To be more specific, the protection layer 70 is formed on the channel protection layer 50 in a manner that each of the source and drain electrodes is covered. The protection layer 70 has a film thickness of 50 nm to 500 nm, for example.

The protection layer 70 comprises an electrically insulating material. For example, the protection layer 70 is a single-layer film comprising one of, or a multilayer film comprising, a silicon oxide film, a silicon nitride film, a silicon oxynitride film, and an aluminum oxide film.

[1-2. Method for Manufacturing Thin Film Transistor Substrate]

Figure 2A:
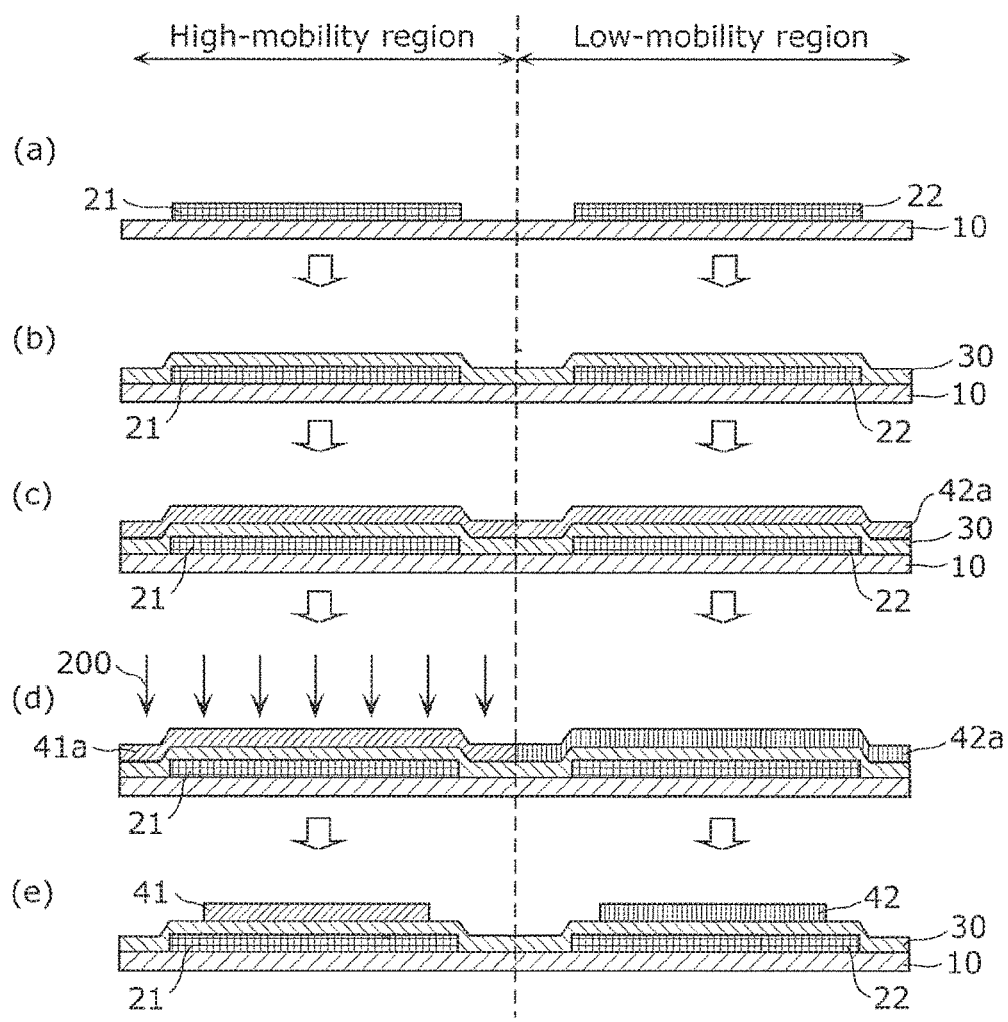
FIG. 2A is a cross-sectional view of processes in a method for manufacturing a thin film transistor substrate according to Embodiment 1.
Figure 2B:
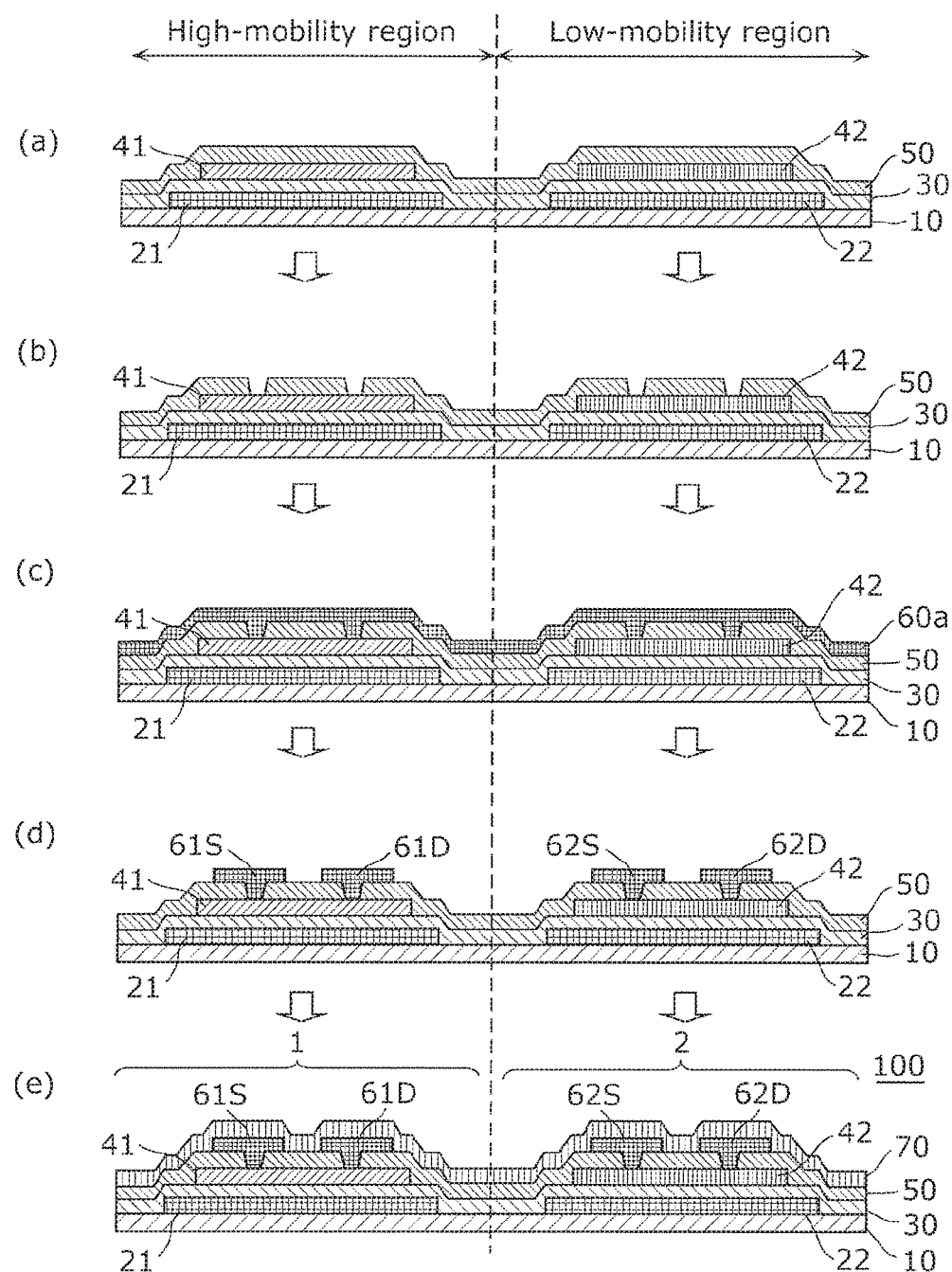
FIG. 2B is a cross-sectional view of processes in a method for manufacturing a thin film transistor substrate according to Embodiment 1.

Next, the following describes a method for manufacturing the thin film transistor substrate 100 according to the present embodiment, with reference to FIG. 2A and FIG. 2B. Each of FIG. 2A and FIG. 2B is a cross-sectional view of processes in the method for manufacturing the thin film transistor substrate 100 according to the present embodiment. Each of FIG. 2A and FIG. 2B shows, on the left-hand side of the drawing, a cross-sectional view for each of the processes performed to form the first thin film transistor 1 (a high-mobility region) in which the first oxide semiconductor layer 41 having a high mobility is used as the channel. Moreover, each of FIG. 2A and FIG. 2B shows, on the right-hand side of the drawing, a cross-sectional view for each of the processes performed to form the second thin film transistor 2 (a low-mobility region) in which the second oxide semiconductor layer 42 having a low mobility is used as the channel.

Firstly, the substrate 10 is prepared, and the first gate electrode 21 and the second gate electrode 22 are formed in the predetermined shapes above the substrate 10 as shown in a cross-sectional view (a) of FIG. 2A. Each of the first gate electrode 21 and the second gate electrode 22 is formed in the predetermined shape by, for example, forming an electrically conductive film on the substrate 10 by a sputtering method and subsequently processing this conductive film by a photolithography method and a wet etching method. Note that an undercoat layer, such as a silicon oxide film, may be formed on the surface of the substrate 10 before the first gate electrode 21 and the second gate electrode 22 are formed.

Next, the gate insulating layer 30 is formed on the first gate electrode 21 and the second gate electrode 22 as shown in a cross-sectional view (b) of FIG. 2A. In the present embodiment, the gate insulating layer 30 is formed on the entire surface of the substrate 10. However, the gate insulating layer 30 may be formed partially, only on the regions of the first thin film transistor 1 and the second thin film transistor 2. It should be noted that when the undercoat layer is formed on the surface of the substrate 10, the gate insulating layer 30 is formed on the undercoat layer.

The gate insulating layer 30 is, for example, a silicon oxide film. In this case, the silicon oxide film can be formed by a plasma chemical vapor deposition (plasma CVD) method, using silane gas ($SiH_4$) and nitrous oxide gas ($N_2O$) as introduced gas. Note that argon (Ar) may be added as diluent gas for the nitrous oxide gas. With this, the gas can be decomposed efficiently, and a high-quality silicon oxide film can be formed. In addition, the amount of nitrous oxide gas to be used can be suppressed.

The gate insulating layer 30 may be either a single-layer film or a multilayer film. For example, the gate insulating layer 30 may be a multilayer film formed by laminating a silicon nitride film and a silicon oxide film sequentially. The silicon nitride film can be formed by the plasma CVD method using, for example, silane gas ($SiH_4$), ammonia gas ($NH_3$), and nitrogen gas ($N_2$) as introduced gas.

Next, a second oxide semiconductor film 42a is formed above the substrate 10, as shown in a cross-sectional view (c) of FIG. 2A. To be more specific, the second oxide semiconductor film 42a (InSiO film) comprising an oxide semiconductor that contains InSiO as a major component is formed on the gate insulating layer 30 by the sputtering method.

More specifically, an oxide semiconductor that contains In and Si (In—Si—O) is used as a sputtering target. Then, argon (Ar) gas is caused to flow into a vacuum chamber as inert gas, and gas containing oxygen ($O_2$) is also caused to flow into the vacuum chamber as reactive gas. With this, a voltage with a predetermined power density is applied to the target material. As a result, the second oxide semiconductor film 42a comprising the InSiO film can be formed on the gate insulating layer 30.

Figure 3:
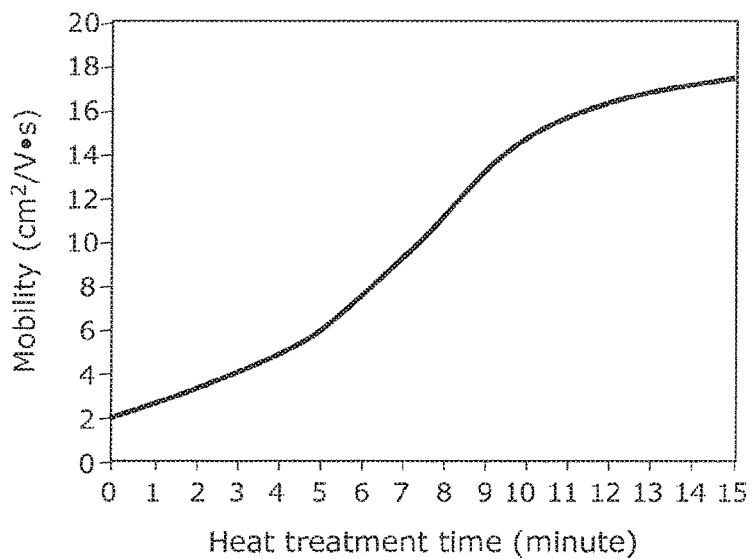
FIG. 3 is a graph showing a relationship between the mobility of InSiO and the annealing time.
Figure 4:
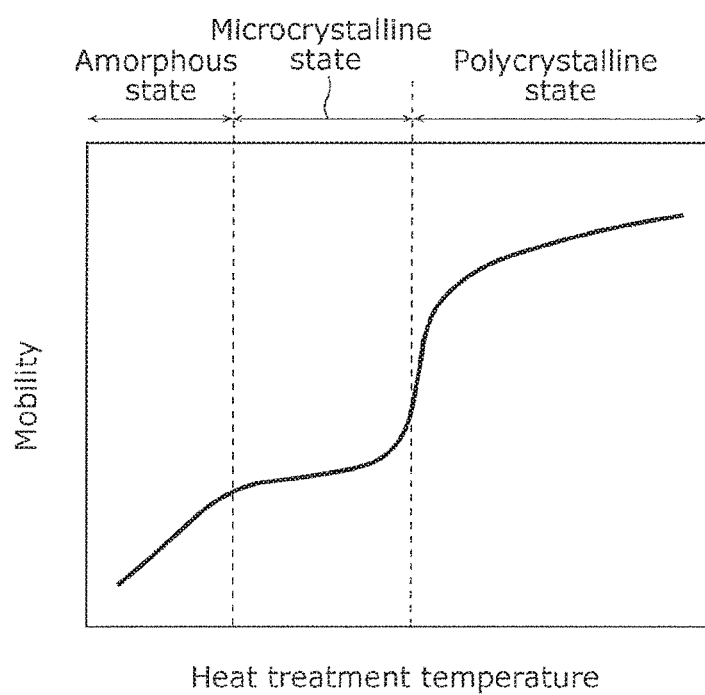
FIG. 4 is a graph showing a relationship between the mobility of silicon and the heat treatment temperature.

Next, heat treatment is performed on a partial region of the second oxide semiconductor film 42a from above the substrate 10, as shown in a cross-sectional view (d) of FIG. 2A. To be more specific, by the heat treatment, the second oxide semiconductor film 42a located in the high-mobility region in which the first thin film transistor 1 is to be formed is irradiated with light 200 from a lamp. Here, a light source that emits the light 200 is not limited to the lamp. For example, the light source may be a laser light source. In the present embodiment, by irradiation for 10 minutes with the light 200 that acts as a heat source at 150° C., the mobility of the second oxide semiconductor film 42a in the high-mobility region can be increased from about 2 $cm^2/Vs$ to about 15 $cm^2/Vs$. Here, the present heat treatment is described with reference to FIG. 3 and FIG. 4. FIG. 3 is a graph showing a relationship between the mobility of InSiO and the annealing time. FIG. 4 is a graph showing a relationship between the mobility of silicon and the heat treatment temperature.

As shown in FIG. 3, the mobility of InSiO gradually increases with the annealing time. The mobility of InSiO does not change rapidly with the annealing time in this way because InSiO maintains an amorphous state even after the heat treatment. Thus, when InSiO is used, the mobility can be accurately adjusted by heat treatment. On the other hand, the mobility of silicon rapidly changes with the heat treatment temperature, as shown in FIG. 4. This is because the silicon structure changes from the amorphous state to a microcrystalline state and to a polycrystalline state with the heat treatment temperature, as shown in FIG. 4. For example, at the heat treatment temperature at which silicon is in the amorphous state, the mobility changes gently with the heat treatment temperature. However, around the heat treatment temperature at which the state of silicon changes into the polycrystalline state, the mobility changes rapidly with the heat treatment temperature. On this account, when silicon is used, it is difficult to accurately adjust the mobility.

As described thus far, when the amorphous oxide semiconductor, such as InSiO, is used as the channel, the mobility can be adjusted extensively with accuracy. In the present embodiment, the second oxide semiconductor film 42a can be increased in mobility by the heat treatment and thus turned into a first oxide semiconductor film 41a.

Next, the first oxide semiconductor layer 41 and the second oxide semiconductor layer 42 in the predetermined shapes are formed by forming the first oxide semiconductor film 41a and the second oxide semiconductor film 42a, respectively, into predetermined shapes, as shown in a cross-sectional view (e) of FIG. 2A.

For example, the first oxide semiconductor film 41a and the second oxide semiconductor film 42a are formed into the first oxide semiconductor layer 41 and the second oxide semiconductor layer 42, respectively, in the predetermined shapes, by a photolithography method and a wet etching method. To be more specific, a resist is firstly formed on each of the first oxide semiconductor film 41a and the second oxide semiconductor film 42a. Then, the resists are processed in a manner that resists are present at least in locations opposite to the first gate electrode 21 and the second gate electrode 22. Following this, regions in which the resists are not formed on the first oxide semiconductor film 41a and the second oxide semiconductor film 42a are removed by an etching method. As a result of this, the first oxide semiconductor layer 41 and the second oxide semiconductor layer 42 can be formed in the shapes of islands in a manner to include the respective locations opposite to the first gate electrode 21 and the second gate electrode 22.

It should be noted that wet etching may be performed using an etching solution, such as a chemical solution mixture of phosphoric acid ($H_3PO_4$), nitric acid ($HNO_3$), acetic acid ($CH_3COOH$), and water.

Next, the channel protection layer 50 is formed on the first oxide semiconductor layer 41 and the second oxide semiconductor layer 42, as shown in a cross-sectional view (a) of FIG. 2B. In the present embodiment, the channel protection layer 50 is formed on the entire surface of the gate insulating layer 30 in a manner that the oxide semiconductor layers are covered.

The channel protection layer 50 is, for example, a silicon oxide film. In this case, the silicon oxide film can be formed by the plasma CVD method using silane gas ($SiH_4$) and nitrous oxide gas ($N_2O$) as introduced gas.

Next, contact holes are formed in the channel protection layer 50 to partially expose the first oxide semiconductor layer 41 and the second oxide semiconductor layer 42, as shown in a cross-sectional view (b) of FIG. 2B. More specifically, a contact hole (opening portion) is formed on each of regions that are to be a source contact region and a drain contact region of the respective oxide semiconductor layers, by partially etching the channel protection layer 50 by the photolithography method and the etching method.

When the channel protection layer 50 is, for example, a silicon oxide film, the contact hole can be formed in the silicon oxide film by using a reactive ion etching (RIE) method as a dry etching method. In this case, carbon tetrafluoride ($CF_4$) and oxygen gas ($O_2$) can be used as etching gas, for example.

Next, a conductive film 60a is formed on the channel protection layer 50 in a manner that the contact holes formed in the channel protection layer 50 are filled, as shown in a cross-sectional view (c) of FIG. 2B. In the present embodiment, a MoW film is formed by the sputtering method in a manner that the entire surface of the channel protection layer 50 is covered.

Next, the first source electrode 61S, the first drain electrode 61D, the second source electrode 62S, and the second drain electrode 62D in the predetermined shapes are formed by forming the conductive film 60a into a predetermined shape, as shown in a cross-sectional view (d) of FIG. 2B.

In the present embodiment, the MoW film is patterned by the photolithography method and the wet etching method. As a result of this, the first source electrode 61S, the first drain electrode 61D, the second source electrode 62S, and the second drain electrode 62D in the predetermined shapes can be formed. Note that a chemical solution mixture of hydrogen peroxide solution ($H_2O_2$) and organic acid may be used as an etching solution for wet etching performed on the MoW film.

Next, the protection layer 70 is formed on the source electrodes and the drain electrodes, as shown in a cross-sectional view (e) of FIG. 2B. In the present embodiment, the protection layer 70 is formed on the entire surface of the channel protection layer 50 in a manner that the source electrodes and the drain electrodes are covered.

The protection layer 70 is, for example, a silicon oxide film. In this case, the silicon oxide film can be formed by the plasma CVD method, using silane gas ($SiH_4$) and nitrous oxide gas ($N_2O$) as introduced gas.

In this way, the thin film transistor substrate 100 shown in FIG. 1 can be manufactured.

1-3. Advantageous Effect Etc.

As described above, the thin film transistor substrate 100 according to the present embodiment includes: the substrate 10; and the first thin film transistor 1 and the second thin film transistor 2 that are disposed on the substrate 10. The first thin film transistor 1 includes the first gate electrode 21 and the first oxide semiconductor layer 41 that is used as the channel. The second thin film transistor 2 includes the second gate electrode 22 and the second oxide semiconductor layer 42 that is used as the channel. Here, the first oxide semiconductor material forming the first oxide semiconductor layer 41 is different in mobility from the second oxide semiconductor material forming the second oxide semiconductor layer 42.

Thus, each of the semiconductor layers used as the channels in the thin film transistor substrate 100 according to the present embodiment comprises an oxide semiconductor. With this, the mobility of the semiconductor layer can be adjusted extensively with accuracy.

Furthermore, the method for manufacturing the thin film transistor substrate 100 according to the present embodiment includes: a first process of preparing the substrate 10; a second process of forming the first gate electrode 21 and the second gate electrode 22 above the substrate 10; a third process of forming the first oxide semiconductor layer 41 and the second oxide semiconductor layer 42 above the substrate 10; a fourth process of forming the first thin film transistor 1 that includes the first gate electrode 21 and the first oxide semiconductor layer 41 that has the channel formed from the first gate electrode 21; and a fifth process of forming the second thin film transistor 2 that includes the second gate electrode 22 and the second oxide semiconductor layer 42 that has the channel formed from the second gate electrode 22. The first oxide semiconductor material forming the first oxide semiconductor layer 41 is different in mobility from the second oxide semiconductor material forming the second oxide semiconductor layer 42.

Thus, by the method for manufacturing the thin film transistor substrate 100 according to the present embodiment, each of the semiconductor layers used as the channels comprises an oxide semiconductor. With this, the mobility of the oxide semiconductor can be adjusted extensively with accuracy.

Furthermore, the method for manufacturing the thin film transistor 100 according to the present embodiment includes: a process of forming the second oxide semiconductor film 42a that comprises the second oxide semiconductor material; and a process of performing heat treatment on a partial region of the second oxide semiconductor film 42a. Moreover, the present manufacturing method includes: a process of forming the first oxide semiconductor layer 41 by patterning the partial region of the second oxide semiconductor film 42a; and a process of forming the second oxide semiconductor layer 42 by patterning a region of the second oxide semiconductor film 42a other than the partial region.

Thus, by the method for manufacturing the thin film transistor substrate 100 according to the present embodiment, the oxide semiconductor film can be formed by a single process and then two oxide semiconductor layers that are different in mobility can be formed. Moreover, since the heat treatment temperature can be a relatively low temperature that is equal to or lower than a melting point of glass, a method like a laser heating method which requires equipment that is relatively complex and large in size is not necessary. Thus, a method like a lamp heating method which requires equipment that is relatively simple and small in size can be adopted. Hence, the equipment used for heat treatment can be simplified.

The thin film transistor substrate 100 according to the present embodiment includes the two oxide semiconductor layers that are different in mobility and that are formed by performing the heat treatment on a part of the oxide semiconductor film comprising a single oxide semiconductor material. However, the method of forming the two oxide semiconductor layers that are different in mobility is not limited to the above method.

For example, the first oxide semiconductor material forming the first oxide semiconductor layer 41 may be different in element structure from the second oxide semiconductor material forming the second oxide semiconductor layer 42. With this, the oxide semiconductor layers that are different in mobility can be obtained. For example, the mobility of InTiO formed using a sputtering target in which a mole ratio between $In_2O$ and $TiO_2$ is 1:0.035 is 32 $cm^2/Vs$. Moreover, the mobility of InWO formed using a sputtering target in which a mole ratio between $In_2O$ and $WO_3$ is 1:0.012 is 30 $cm^2/Vs$. Furthermore, the mobility of InSiO formed using a sputtering target in which a mole ratio between $In_2O$ and $SiO_2$ is 1:0.047 is 17 $cm^2/Vs$. Other examples of the InO-based oxide semiconductor material include $In_2O_3$, InTiO, InZnO, Sn—InZnO, InGaO, Hf—InZnO, Si—InZnO, Zr—InZnO, InSnO, and InGaZnO. Moreover, an oxide semiconductor material that is not InO-based, such as ZnON (zinc oxynitride), may be used as the oxide semiconductor.

Figure 5:
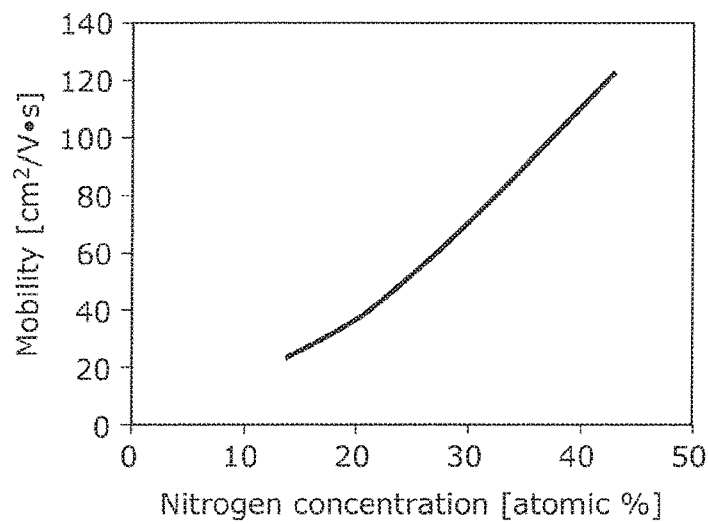
FIG. 5 is a graph showing a relationship between the mobility of ZnON and the nitrogen concentration.
Figure 6:
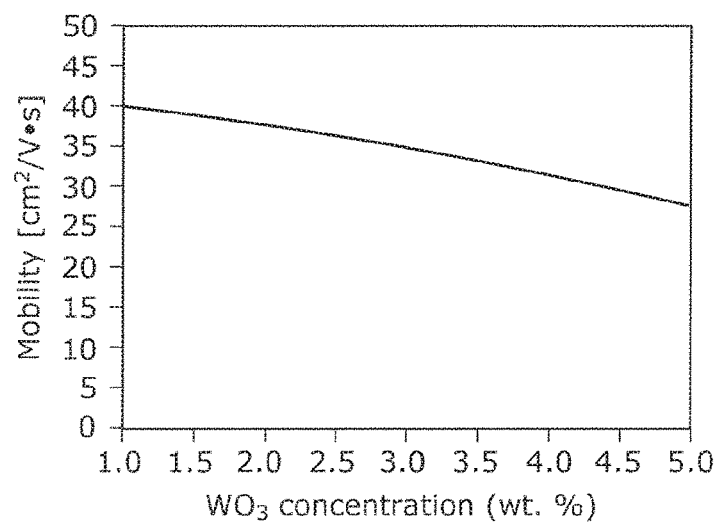
FIG. 6 is a graph showing a relationship between the mobility of InWO and the $WO_3$ concentration.

Moreover, the first oxide semiconductor material forming the first oxide semiconductor layer 41 and the second oxide semiconductor material forming the second oxide semiconductor layer 42 may be the same in element structure and different in element ratio. For example, when when the element structure of the oxide semiconductor material is ZnON, the mobility can be adjusted by changing the nitrogen concentration without changing the element structure. FIG. 5 is a graph showing a relationship between the mobility of ZnON and the nitrogen concentration. As shown in FIG. 5, the mobility of ZnON increases with an increase in the nitrogen concentration. To form the oxide semiconductor films comprising ZnON and different in mobility, two ZnON films that are different in the nitrogen concentration may be formed. Alternatively, a ZnON film that is constant in the nitrogen concentration may be partially adjusted in the nitrogen concentration. For example, the nitrogen concentration of the ZnON film can be increased by irradiation of the ZnON film with nitrogen plasma. Moreover, the nitrogen concentration of the ZnON film can be reduced by irradiation of the ZnON film with oxygen plasma. Furthermore, the nitrogen concentration of the ZnON film can also be reduced by annealing the ZnON film to cause the ejection of nitrogen atoms. Here, when the element structure of the oxide semiconductor material is InWO, the mobility can be adjusted by changing the $WO_3$ concentration without changing the element structure. FIG. 6 is a graph showing a relationship between the mobility of InWO and the $WO_3$ concentration. Note that the $WO_3$ concentration refers to the ratio of $WO_3$ by weight with respect to $In_2O$ contained in the sputtering target used when an InWO film is to be formed. As shown in FIG. 6, the mobility of InWO decreases with an increase in the $WO_3$ concentration.

Embodiment 2

The following describes a thin film transistor substrate 100a and a method for manufacturing the same according to Embodiment 2, with reference to the drawings.

For the thin film transistor substrate 100 according to Embodiment 1 described above, the configuration in which only one oxide semiconductor film is formed is adopted. For the thin film transistor substrate 100a according to the present embodiment, on the other hand, a configuration in which two different oxide semiconductor films are formed is adopted.

The following mainly describes differences between the thin film transistor substrate 100a and the method for manufacturing the same according to the present embodiment and the thin film transistor substrate 100 and the method for manufacturing the same according to Embodiment 1. Thus, descriptions of the configuration and manufacturing processes identical between the present embodiment and Embodiment 1 are omitted.

2-1. Configuration of Thin Film Transistor Substrate

Figure 7:
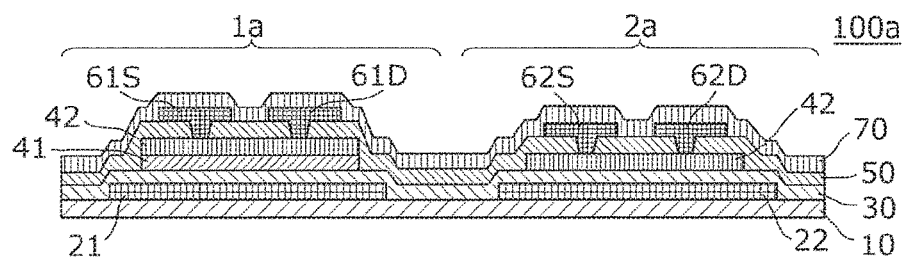
FIG. 7 is a cross-sectional view of a thin film transistor substrate according to Embodiment 2.

Firstly, the configuration of the thin film transistor substrate 100a according to the present embodiment is described, with reference to FIG. 7. FIG. 7 is a cross-sectional view of the thin film transistor substrate 100a according to the present embodiment.

As shown in FIG. 7, the thin film transistor substrate 100a includes, as with the thin film transistor substrate 100 according to Embodiment 1 above: a substrate 10; and a first thin film transistor 1a and a second thin film transistor 2a that are formed on the substrate 10. Each of the first thin film transistor 1a and the second thin film transistor 2a is a channel-protection bottom-gate TFT in which the top-contact configuration is adopted.

The following mainly describes in detail the differences in the structural elements between the thin film transistor substrate 100a according to the present embodiment and the thin film transistor substrate 100 according to Embodiment 1 above.

The first thin film transistor 1a includes a first gate electrode 21, a gate insulating layer 30, a first oxide semiconductor layer 41, a channel protection layer 50, a first source electrode 61S, a first drain electrode 61D, and a protection layer 70, as with the thin film transistor 1 described above. The first thin film transistor 1a further includes a second oxide semiconductor layer 42. Moreover, the second thin film transistor 2a includes a second gate electrode 22, the gate insulating layer 30, the second oxide semiconductor layer 42, the channel layer 50, a second source electrode 62S, a second drain electrode 62D, and the protection layer 70, as with the thin film transistor 2 described above.

As described above, the thin film transistor substrate 100a according to the present embodiment is different from the thin film transistor substrate 100 according to Embodiment 1 in that the second oxide semiconductor layer 42 is provided on the first oxide semiconductor layer 41 of the first thin film transistor 1a. Furthermore, the present embodiment describes an example in which ZnON is used as the oxide semiconductor material.

In the present embodiment, the first oxide semiconductor layer 41 is formed in a predetermined shape on the gate insulating layer 30 above the first gate electrode 21. Moreover, the second oxide semiconductor layer 42 is formed in a predetermined shape both above the second gate electrode 22 and on the first oxide semiconductor layer 41. In the present embodiment, a channel of the first thin film transistor 1a is formed in the first oxide semiconductor layer 41 and a channel of the second thin film transistor 2a is formed in the second oxide semiconductor layer 42. Each of the first oxide semiconductor layer 41 and the second oxide semiconductor layer 42 has a film thickness of 30 nm to 300 nm, for example.

Each of the first oxide semiconductor layer 41 and the second oxide semiconductor layer 42 contains, as a major component, ZnON that is an oxide semiconductor material. A first oxide semiconductor material forming the first oxide semiconductor layer 41 is different in mobility from a second oxide semiconductor material forming the second oxide semiconductor layer 42. In the present embodiment, the nitrogen concentration of the first oxide semiconductor material is higher than that of the second oxide semiconductor material so that the first oxide semiconductor material has a higher mobility than the second oxide semiconductor material.

The other structural elements included in the thin film transistor substrate 100a according to the present embodiment are the same as those included in the thin film transistor substrate 100 according to Embodiment 1.

2-2. Method for Manufacturing Thin Film Transistor Substrate

Figure 8A:
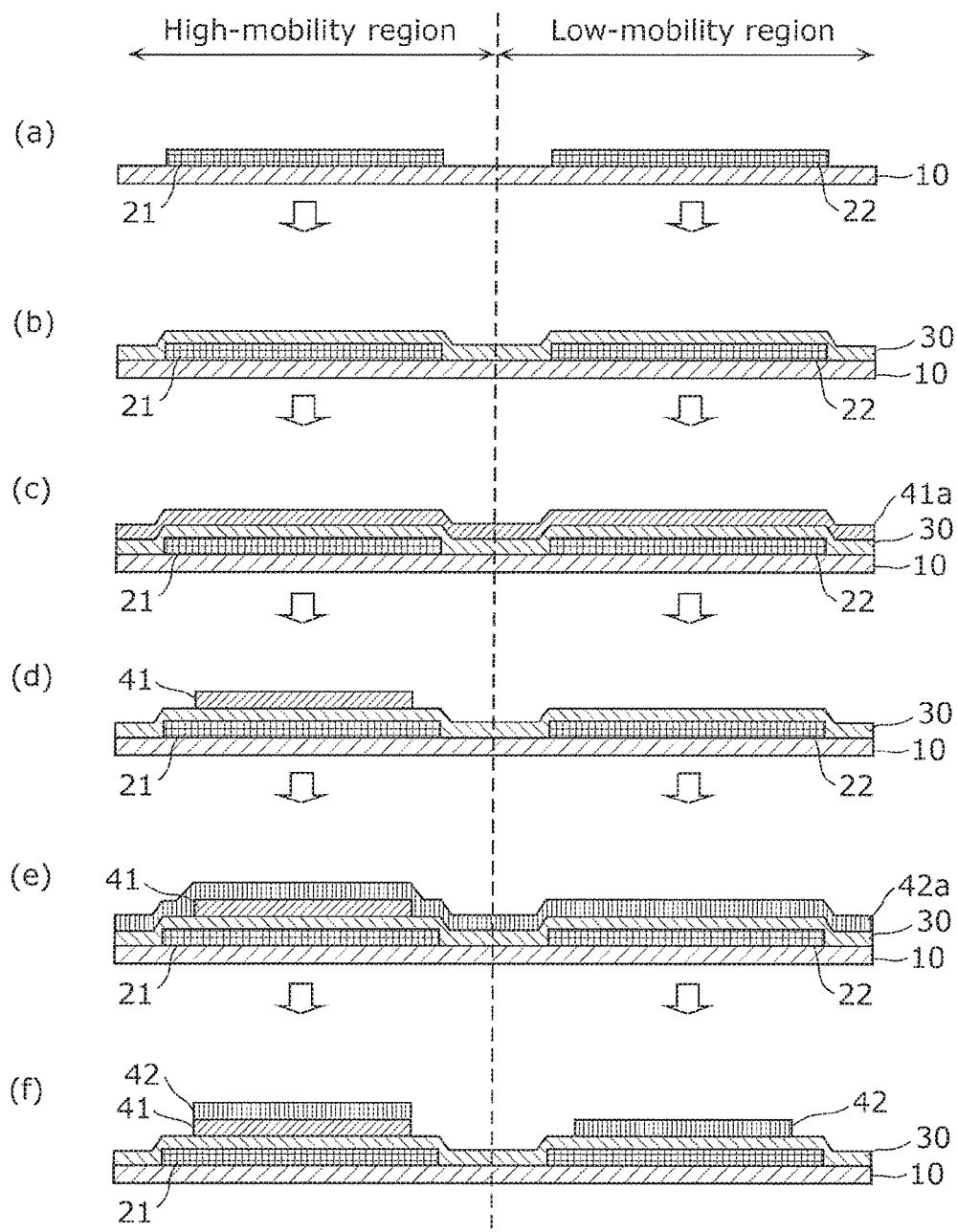
FIG. 8A is a cross-sectional view of processes in a method for manufacturing a thin film transistor substrate according to Embodiment 2.
Figure 8B:
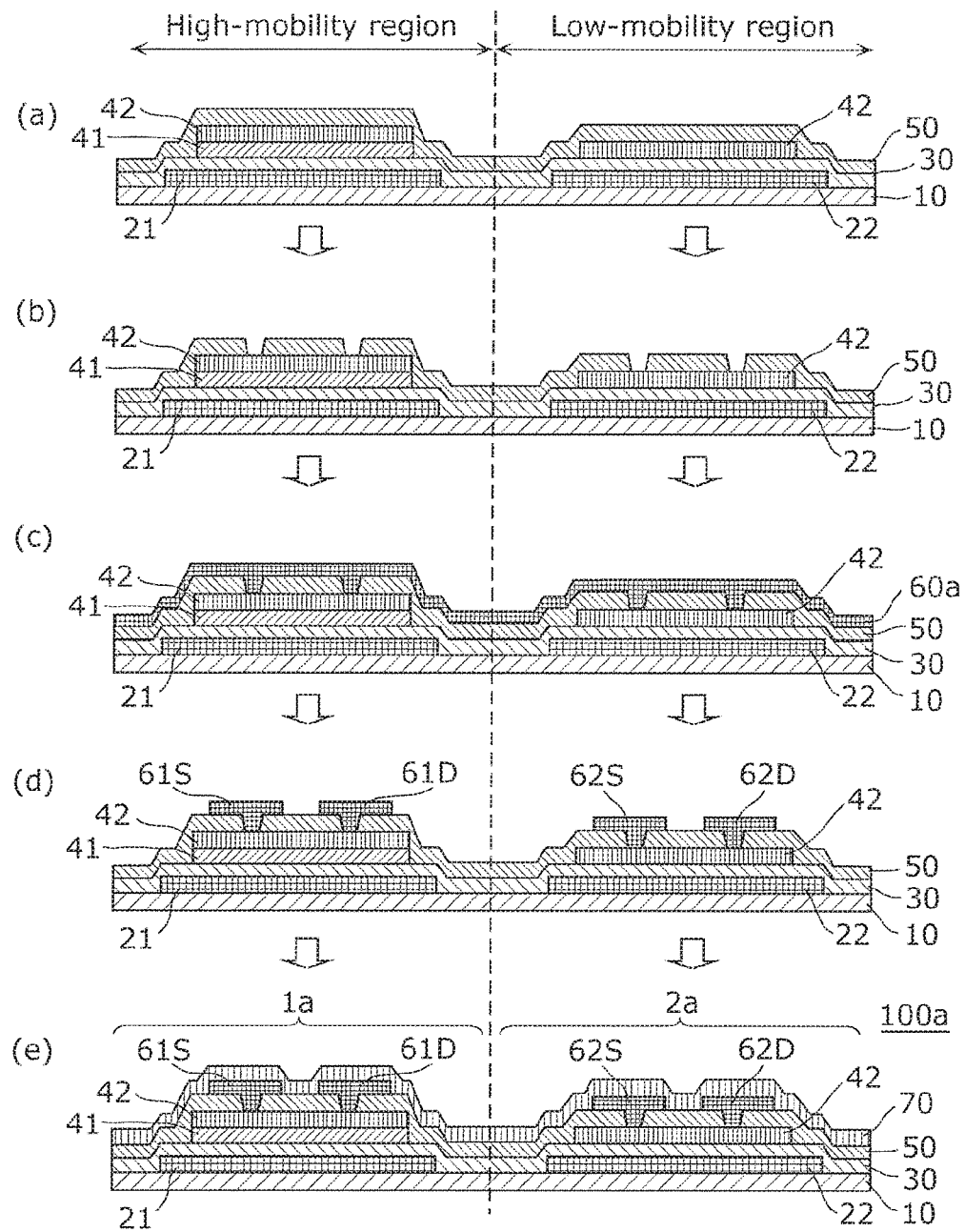
FIG. 8B is a cross-sectional view of processes in a method for manufacturing a thin film transistor substrate according to Embodiment 2.

Next, the following describes a method for manufacturing the thin film transistor substrate 100a according to the present embodiment, with reference to FIG. 8A and FIG. 8B. Each of FIG. 8A and FIG. 8B is a cross-sectional view of processes in the method for manufacturing the thin film transistor substrate 100a according to the present embodiment. Each of FIG. 8A and FIG. 8B shows, on the left-hand side of the drawing, a cross-sectional view for each of the processes performed to form the first thin film transistor 1a (a high-mobility region) in which the first oxide semiconductor layer 41 having a high mobility is used as the channel. Moreover, each of FIG. 8A and FIG. 8B shows, on the right-hand side of the drawing, a cross-sectional view for each of the processes performed to form the second thin film transistor 2a (a low-mobility region) in which the second oxide semiconductor layer 42 having a low mobility is used as the channel.

Among the layer formation processes, the same processes as those in Embodiment 1 are not described in detail.

Firstly, as in the case of the thin film transistor substrate 100 according to Embodiment 1, the first gate electrode 21, the second gate electrode 22, and the gate insulating layer 30 are formed above the substrate 10, as shown in cross-sectional views (a) and (b) of FIG. 8A.

Next, a first oxide semiconductor film 41a is formed above the substrate 10, as shown in a cross-sectional view (c) of FIG. 8A. To be more specific, the first oxide semiconductor film 41a (ZnON film) comprising an oxide semiconductor that contains ZnON as a major component is formed on the gate insulating layer 30 by the sputtering method.

More specifically, zinc (Zn) (Purity: 99.99% or higher) is used as a sputtering target. Then, argon (Ar) gas is caused to flow into a vacuum chamber as inert gas, and gas containing nitrogen ($N_2$) and oxygen ($O_2$) is also caused to flow into the vacuum chamber as reactive gas. Here, the reactive gas may contain nitrous oxide ($N_2O$). With this, a voltage is applied to the target material so that the power density is 0.18 $W/cm^2$ to 0.36 $W/cm^2$. With this, the first oxide semiconductor film 41a comprising the ZnON film can be formed on the gate insulating layer 30. It should be noted that the sputtering target is not limited to the pure zinc. For example, the sputtering target may be zinc that contains 1% or less aluminum (Al) or tin (Sn).

Moreover, when oxygen ($O_2$) and nitrogen ($N_2$) are used as the reactive gas, the flow ratio between oxygen and nitrogen may be 1:100 to 10:100, as a condition for forming the first oxide semiconductor film 41a. By an adjustment in this flow ratio, the nitrogen concentration and mobility of the first oxide semiconductor film 41a (ZnON film) can be changed. Furthermore, a substrate temperature may be set at room temperature, for example.

Next, the first oxide semiconductor layer 41 in the predetermined shape is formed by forming the first oxide semiconductor film 41a into a predetermined shape, as shown in a cross-sectional view (d) of FIG. 8A.

For example, the first oxide semiconductor film 41a is formed into the first oxide semiconductor layer 41 in the predetermined shape, by the photolithography method and the wet etching method. To be more specific, a resist is firstly formed on the first oxide semiconductor film 41a. Then, the resist is processed in a manner that the resist is present at least in a location opposite to the first gate electrode 21. Following this, a region in which the resist is not formed on the first oxide semiconductor film 41a is removed by the etching method. As a result of this, the first oxide semiconductor layer 41 can be formed in the shape of an island in a manner to include the location opposite to the first gate electrode 21.

It should be noted that wet etching may be performed using an etching solution, such as oxalic acid. Moreover, a temperature for etching may be 40° C.

Next, the second oxide semiconductor film 42a is formed above the substrate 10, as shown in a cross-sectional view (e) of FIG. 8A. To be more specific, the second oxide semiconductor film 42a (ZnON film) comprising an oxide semiconductor that contains ZnON as a major component is formed on the gate insulating layer 30 by the sputtering method in a manner that the first oxide semiconductor layer 41 is covered. A specific method of film formation here is the same as the method for forming the first oxide semiconductor film 41a. Note, however, that the second oxide semiconductor film 42a is formed in a manner that the nitrogen concentration and mobility of the second oxide semiconductor film 42a are lower than those of the first oxide semiconductor film 41a.

Next, the second oxide semiconductor layer 42 in the predetermined shape is formed by forming the second oxide semiconductor film 42a into a predetermined shape, as shown in a cross-sectional view (f) of FIG. 8A. The second oxide semiconductor layer 42 is formed in the shape of an island in a manner to include a location opposite to the second gate electrode 22. Here, the second oxide semiconductor layer 42 is also formed on the first oxide semiconductor layer 41 in the same shape as the first oxide semiconductor layer 41. A specific method of film formation here is the same as the method for forming the first oxide semiconductor layer 41.

Next, as in Embodiment 1, the channel protection layer 50, the first source electrode 61S, the first drain electrode 61D, the second source electrode 62S, the second drain electrode 62D, and the protection layer 70 are formed, as shown in cross-sectional views (a) to (e) of FIG. 8B.

In this way, the thin film transistor substrate 100a shown in FIG. 7 can be manufactured.

2-3. Advantageous Effect Etc.

As described above, as in the thin film transistor substrate 100 according to Embodiment 1 above, each of the semiconductor layers used as the channels in the thin film transistor substrate 100a according to the present embodiment also comprises an oxide semiconductor. With this, the mobility of the semiconductor layer can be adjusted extensively with accuracy.

Furthermore, in the thin film transistor substrate 100a according to the present embodiment, the first oxide semiconductor layer 41 is disposed above the first gate electrode 21, and the first thin film transistor 1a includes the second oxide semiconductor layer 42 disposed on the first oxide semiconductor layer 41. Here, the second oxide semiconductor material forming the second oxide semiconductor layer 42 has a lower mobility than the first oxide semiconductor material forming the first oxide semiconductor layer 41. More specifically, the first thin film transistor 1a of the thin film transistor substrate 100a according to the present embodiment includes, on the back-channel side, the second oxide semiconductor layer 42 that is lower in mobility than the first oxide semiconductor layer 41.

With this, since the semiconductor layer having a high mobility is disposed as the channel located on the bottom-gate electrode side of the first thin film transistor 1a according to the present embodiment, an on-state current of the channel is high. On the other hand, since the semiconductor layer having a low mobility is disposed as the channel located on the bottom-gate electrode side of the second thin film transistor 2a according to the present embodiment, the on-state current of the channel is low. Furthermore, the placement of the semiconductor layer with the low mobility on the back-channel side of the first thin film transistor 1a can inhibit a leakage current from occurring on the back-channel side.

Moreover, by the method for manufacturing the thin film transistor substrate 100a according to the present embodiment as with the manufacturing method according to Embodiment 1, each of the semiconductor layers used as the channels comprises an oxide semiconductor. With this, the mobility of the semiconductor layer can be adjusted extensively with accuracy.

Furthermore, the method for manufacturing the thin film transistor substrate 100a according to the present embodiment includes: a process of forming the first oxide semiconductor film 41a comprising the first oxide semiconductor material above the first gate electrode 21; and a process of forming the first oxide semiconductor layer 41 by patterning the first oxide semiconductor film 41a. Moreover, the present manufacturing method includes: a process of forming the second oxide semiconductor film 42a comprising the second oxide semiconductor material both on the first oxide semiconductor layer 41 and above the second gate electrode 22; and forming the second oxide semiconductor layer 42 both on the first oxide semiconductor layer 41 and above the second gate electrode 22, by patterning the second oxide semiconductor film 42a. Here, the second oxide semiconductor material has a lower mobility than the first oxide semiconductor material.

With this, since the semiconductor layer having the high mobility is disposed as the channel located on the bottom-gate electrode side of the first thin film transistor 1a according to the present embodiment, the on-state current of the channel is high. On the other hand, since the semiconductor layer having the low mobility is disposed as the channel located on the bottom-gate electrode side of the second thin film transistor 2a according to the present embodiment, the on-state current of the channel is low. Furthermore, the placement of the semiconductor layer with the low mobility on the back-channel side of the first thin film transistor 1a can inhibit a leakage current from occurring on the back-channel side.

In the present embodiment, the second oxide semiconductor layer 42 is formed on the first oxide semiconductor layer 41. However, it should be noted that an oxide semiconductor layer comprising, instead of the second oxide semiconductor material, an oxide semiconductor material that has a lower mobility than the first oxide semiconductor material may be formed on the first oxide semiconductor layer 41.

Embodiment 3

The following describes a thin film transistor substrate 100b and a method for manufacturing the same according to Embodiment 3, with reference to the drawings.

Each of the thin film transistor substrates according to the embodiments described above includes the bottom-gate TFT. On the other hand, the thin film transistor substrate 100b according to the present embodiment includes a bottom-gate TFT and a top-gate TFT.

The following mainly describes differences between the thin film transistor substrate 100b and the method for manufacturing the same according to the present embodiment and the thin film transistor substrate 100 and the method for manufacturing the same according to Embodiment 1. Thus, descriptions of the configuration and manufacturing processes identical between the present embodiment and Embodiment 1 are omitted.

3-1. Configuration of Thin Film Transistor Substrate

Figure 9:
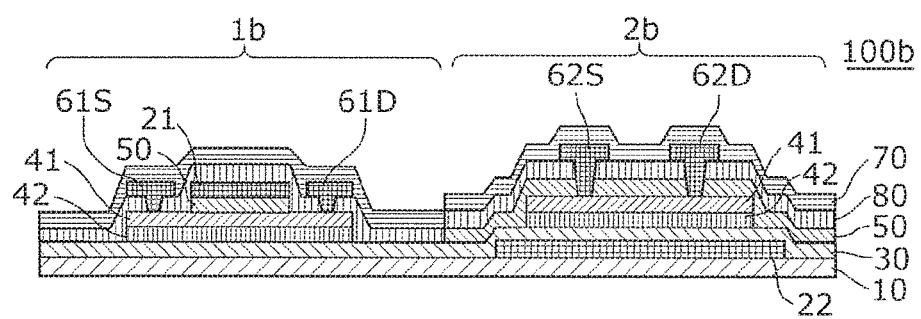
FIG. 9 is a cross-sectional view of a thin film transistor substrate according to Embodiment 3.

Firstly, the configuration of the thin film transistor substrate 100b according to the present embodiment is described, with reference to FIG. 9. FIG. 9 is a cross-sectional view of the thin film transistor substrate 100b according to the present embodiment.

As shown in FIG. 9, the thin film transistor substrate 100b includes, as with the thin film transistor substrate 100 according to Embodiment 1 above: a substrate 10; and a first thin film transistor 1b and a second thin film transistor 2b that are formed on the substrate 10. The first thin film transistor 1b is a top-gate TFT in which the channel-protection top-contact configuration is adopted. On the other hand, the second thin film transistor 2b is a channel-protection bottom-gate TFT in which the top-contact configuration is adopted.

The following mainly describes in detail the differences in the structural elements between the thin film transistor substrate 100b according to the present embodiment and the thin film transistor substrate 100 according to Embodiment 1 above.

The first thin film transistor 1b includes a first gate electrode 21, a gate insulating layer 30, a first oxide semiconductor layer 41, a channel protection layer 50, a first source electrode 61S, a first drain electrode 61D, and a protection layer 70, as with the thin film transistor 1 described above. The first thin film transistor 1b further includes a second oxide semiconductor layer 42 and an insulating layer 80. Moreover, the second thin film transistor 2a includes a second gate electrode 22, the gate insulating layer 30, the second oxide semiconductor layer 42, the channel layer 50, a second source electrode 62S, a second drain electrode 62D, and the protection layer 70, as with the thin film transistor 2 described above. The second thin film transistor 2a further includes the first oxide semiconductor layer 41 and the insulating layer 80. Furthermore, the present embodiment describes an example in which ZnON is used as the oxide semiconductor material as in the case of the thin film transistor substrate 100a according to Embodiment 2 above.

The insulating layer 80 is disposed on the first gate electrode 21 on the first thin film transistor 1b side, and is disposed on the channel protection layer 50 on the second thin film transistor 2b side. The insulating layer 80 has a film thickness of 50 nm to 500 nm, for example.

More specifically, the insulating layer 80 is an interlayer insulating layer that provides electrical isolation between the first gate electrode 21 and a conductive film 60a formed above the first gate electrode 21.

The insulating layer 80 comprises an electrically insulating material. For example, the insulating layer 80 is a single-layer film comprising one of, or a multilayer film comprising, a silicon oxide film, a silicon nitride film, a silicon oxynitride film, and an aluminum oxide film.

In each of the first thin film transistor 1b and the second thin film transistor 2b according to the present embodiment, the second oxide semiconductor layer 42 and the first oxide semiconductor layer 41 are disposed on the gate insulating layer 30 in the stated order from the bottom. In the first thin film transistor 1b, the first gate electrode 21 is disposed above the first oxide semiconductor layer 41 with the channel protection layer 50 being interposed in between. In the second thin film transistor 2b, on the other hand, the second gate electrode 22 is disposed below the second oxide semiconductor layer 42 with the gate insulating layer 30 being interposed in between.

The first oxide semiconductor layer 41 and the second oxide semiconductor layer 42 have the same configurations as those in the thin film transistor substrate 100a according to Embodiment 2 above.

The other structural elements included in the thin film transistor substrate 100b according to the present embodiment are the same as those included in the thin film transistor substrate 100 according to Embodiment 1.

3-2. Method for Manufacturing Thin Film Transistor Substrate

Figure 10A:
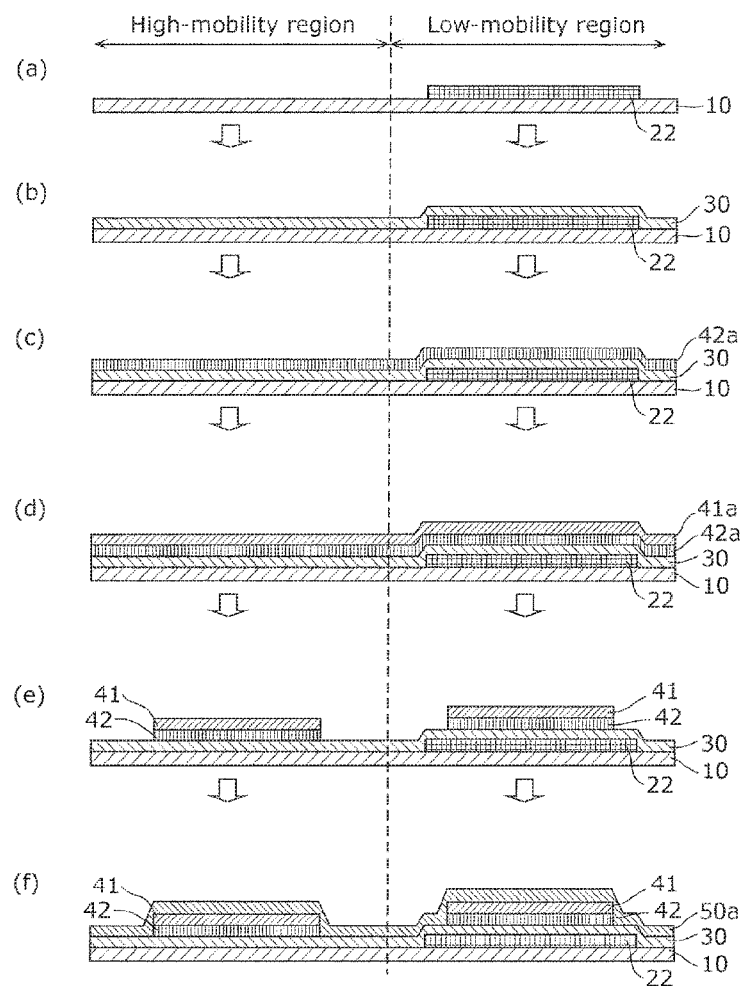
FIG. 10A is a cross-sectional view of processes in a method for manufacturing a thin film transistor substrate according to Embodiment 3.
Figure 10B:
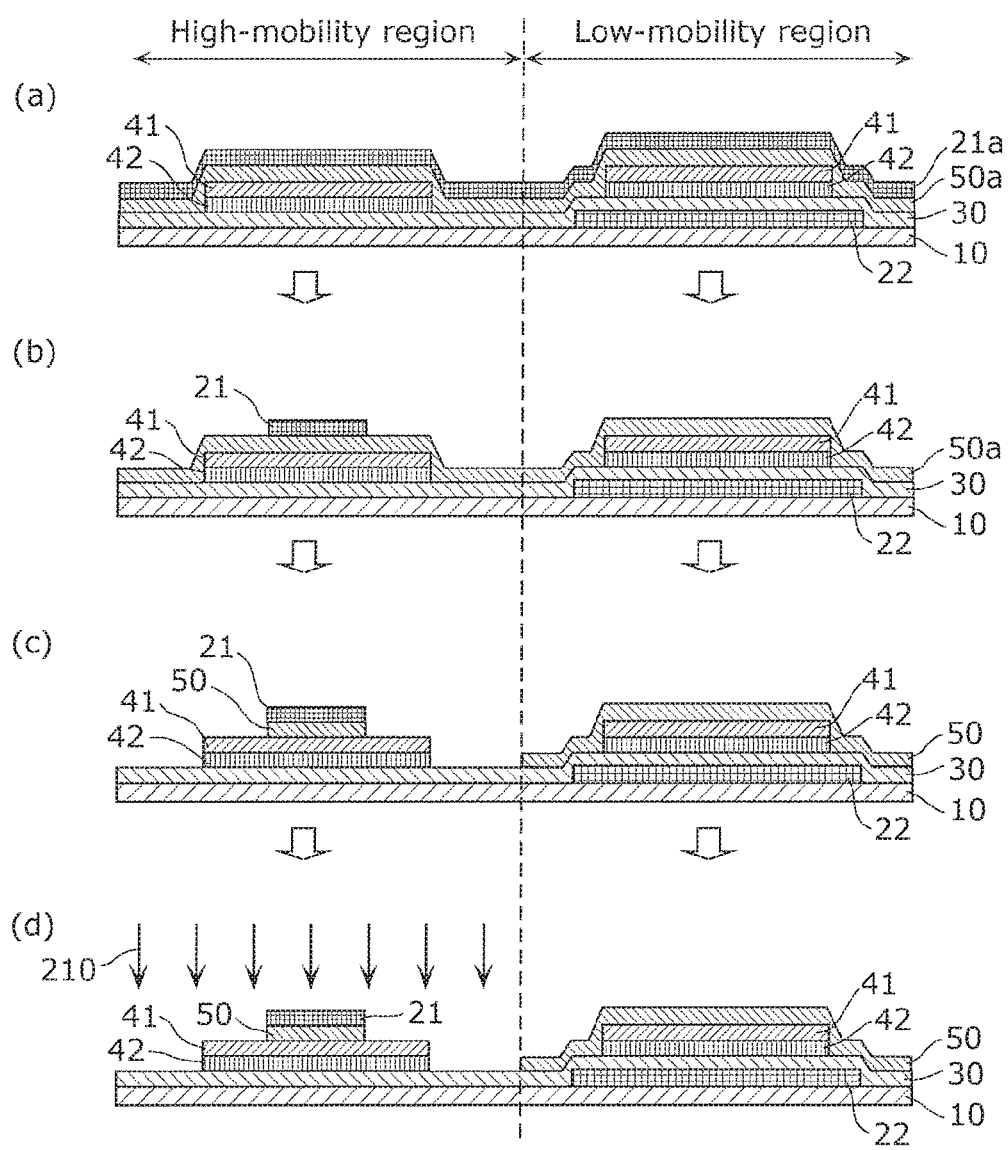
FIG. 10B is a cross-sectional view of processes in a method for manufacturing a thin film transistor substrate according to Embodiment 3.
Figure 10C:
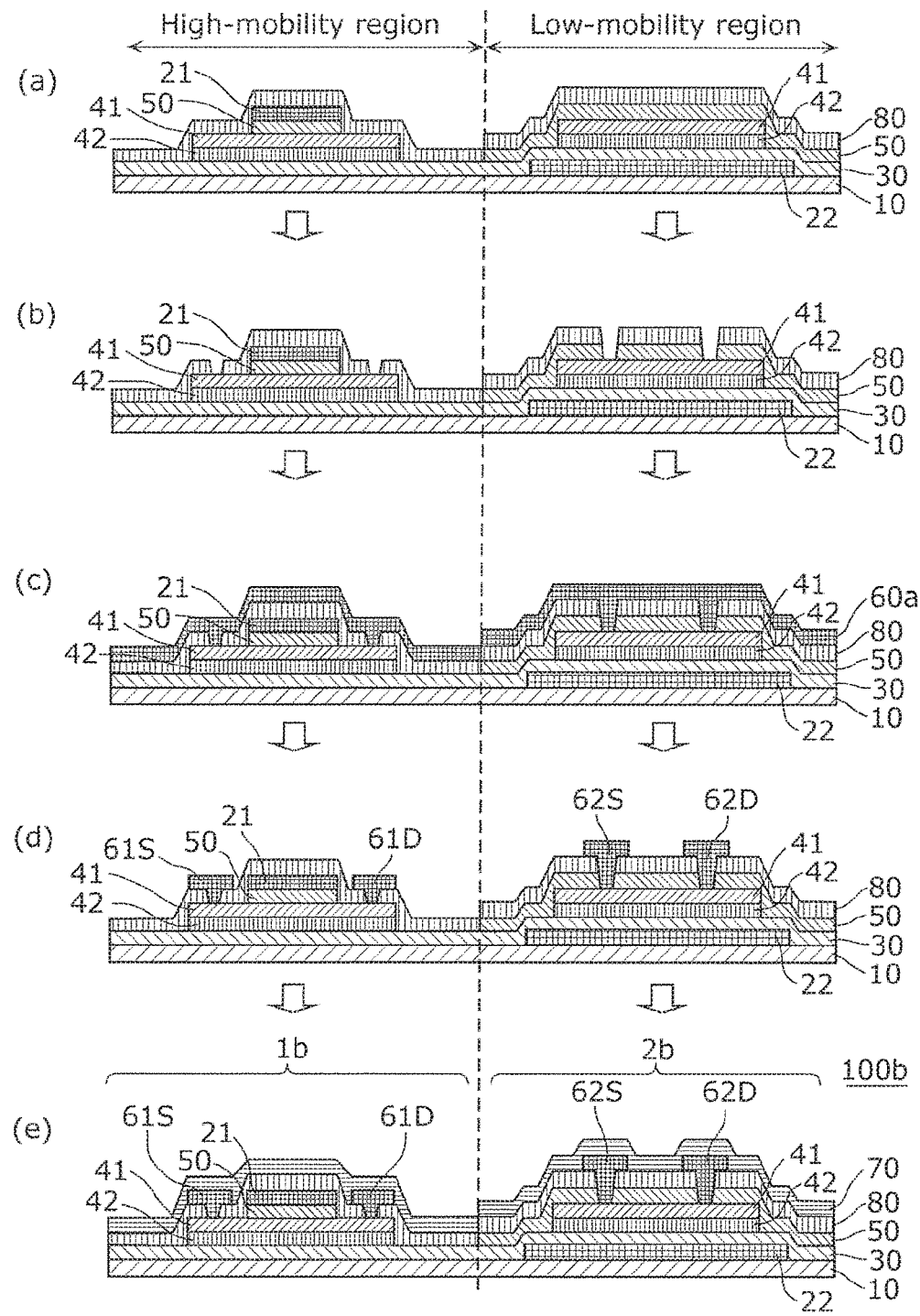
FIG. 10C is a cross-sectional view of processes in a method for manufacturing a thin film transistor substrate according to Embodiment 3.

Next, the following describes a method for manufacturing the thin film transistor substrate 100b according to the present embodiment, with reference to FIG. 10A, FIG. 10B, and FIG. 10C. Each of FIG. 10A, FIG. 10B, and FIG. 10C is a cross-sectional view of processes in the method for manufacturing the thin film transistor substrate 100b according to the present embodiment. Each of FIG. 10A, FIG. 10B, and FIG. 10C shows, on the left-hand side of the drawing, a cross-sectional view for each of the processes performed to form the first thin film transistor 1b (a high-mobility region) in which the first oxide semiconductor layer 41 having a high mobility is used as the channel. Moreover, each of FIG. 10A, FIG. 10B, and FIG. 10C shows, on the right-hand side of the drawing, a cross-sectional view for each of the processes performed to form the second thin film transistor 2b (a low-mobility region) in which the second oxide semiconductor layer 42 having a low mobility is used as the channel.

Among the layer formation processes, the same processes as those in Embodiment 1 are not described in detail.

Firstly, the substrate 10 is prepared, and the second gate electrode 22 is formed in the low-mobility region above the substrate 10, as shown in a cross-sectional view (a) of FIG. 10A.

Next, the gate insulating layer 30 is formed on the second gate electrode 22 as shown in a cross-sectional view (b) of FIG. 10A. In the present embodiment, the gate insulating layer 30 is formed on the entire surface of the substrate 10 in a manner that the second gate electrode 22 is covered.

Next, a second oxide semiconductor film 42a is formed above the substrate 10, as shown in a cross-sectional view (c) of FIG. 10A. To be more specific, the second oxide semiconductor film 42a (ZnON film) comprising an oxide semiconductor that contains ZnON as a major component is formed on the gate insulating layer 30 by the sputtering method. A specific method of film formation here is the same as the method for forming the second oxide semiconductor film 42a according to Embodiment 2 above.

Next, the first oxide semiconductor film 41a is formed above the substrate 10, as shown in a cross-sectional view (d) of FIG. 10A. To be more specific, the first oxide semiconductor film 41a (ZnON film) comprising an oxide semiconductor that contains ZnON as a major component is formed on the second oxide semiconductor film 42a by the sputtering method. A specific method of film formation here is the same as the method for forming the first oxide semiconductor film 41a according to Embodiment 2 above.

Next, the second oxide semiconductor layer 42 and the first oxide semiconductor layer 41 in predetermined shapes are formed by forming the second oxide semiconductor film 42a and the first oxide semiconductor film 41a into predetermined shapes, as shown in a cross-sectional view (e) of FIG. 10A. A specific method of formation here is the same as the method for forming the first oxide semiconductor film 41a and the second oxide semiconductor film 42a according to Embodiment 2 above.

Next, a channel protection film 50a is formed on the first oxide semiconductor layer 41, as shown in a cross-sectional view (f) of FIG. 10A. In the present embodiment, the channel protection film 50a is formed on the entire surface of the gate insulating layer 30 in a manner that the oxide semiconductor layers are covered.

Next, a conductive film 21a is formed on the channel protection film 50a, as shown in a cross-sectional view (a) of FIG. 10B. For example, the conductive film is formed on the channel protection film 50a by the sputtering method.

Next, the first gate electrode 21 in a predetermined shape is formed above the first oxide semiconductor layer 41 in the high-mobility region by forming the conductive film 21a into a predetermined shape, as shown in a cross-sectional view (b) of FIG. 10B. For example, the first gate electrode 21 in the predetermined shape is formed by processing the conductive film 21a by the photolithography method and the wet etching method.

Next, the channel protection layer 50 is formed by removing a portion that is included in the channel protection film 50a in the high-mobility region and that is not covered by the first gate electrode 21, as shown in a cross-sectional view (c) of FIG. 10B. To be more specific, the channel protection layer 50 is formed by etching the portion that is included in the channel protection film 50a in the high-mobility region and that is not covered by the first gate electrode 21 by the etching method.

When the channel protection film 50a is, for example, a silicon oxide film, the silicon oxide film can be removed by using the reactive ion etching (RIE) method as the dry etching method. In this case, carbon tetrafluoride ($CF_4$) and oxygen gas ($O_2$) can be used as etching gas, for example.

Next, the high-mobility region is irradiated with an oxygen plasma 210, as shown in a cross-sectional view (d) of FIG. 10B. With this, an oxygen defect is caused to an exposed portion of the first oxide semiconductor layer 41 and the exposed portion thereby becomes a low-resistance portion. As a result, a self-aligning structure can be achieved in which an end face of the first gate electrode 21 is flush with an end face of the low-resistance portion of the semiconductor.

Next, the insulating layer 80 is formed on the first electrode 21, the first oxide semiconductor layer 41, and the channel protection layer 50, as shown in a cross-sectional view (a) of FIG. 10C. In the present embodiment, the insulating layer 80 is formed on the entire surface of the gate insulating layer 30 in a manner that the first gate electrode 21, the first oxide semiconductor layer 41, and the channel protection layer 50 are covered.

The insulating layer 80 is, for example, a silicon oxide film. In this case, the silicon oxide film can be formed by the plasma CVD method using silane gas ($SiH_4$) and nitrous oxide gas ($N_2O$) as introduced gas.

Next, contact holes are formed in the insulating layer 80 and the channel protection layer 50 to partially expose the first oxide semiconductor layer 41, as shown in a cross-sectional view (b) of FIG. 10C. More specifically, a contact hole (opening portion) is formed on each of regions that are to be a source contact region and a drain contact region of the first oxide semiconductor layer 41, by partially etching the insulating layer 80 and the channel protection layer 50 by the photolithography method and the etching method.

Next, the conductive film 60a is formed in a manner that the contact holes formed in the insulating layer 80 and the channel protection layer 50 are filled, as shown in a cross-sectional view (c) of FIG. 10C. In the present embodiment, a MoW film is formed in a manner that the entire surface of the channel protection layer 50 is covered.

Next, the first source electrode 61S, the first drain electrode 61D, the second source electrode 62S, and the second drain electrode 62D in predetermined shapes are formed by forming the conductive film 60a into a predetermined shape, as shown in a cross-sectional view (d) of FIG. 10C.

Next, the protection layer 70 is formed on the source electrodes and the drain electrodes, as shown in a cross-sectional view (e) of FIG. 10C. In the present embodiment, the protection layer 70 is formed on the entire surface of the insulating layer 80 in a manner that the source electrodes and the drain electrodes are covered.

In this way, the thin film transistor substrate 100b shown in FIG. 9 can be manufactured.

3-3. Advantageous Effect Etc.

As described above, as in the thin film transistor substrate 100 according to Embodiment 1 above, each of the semiconductor layers used as the channels in the thin film transistor substrate 100b according to the present embodiment also comprises an oxide semiconductor. With this, the mobility of the semiconductor layer can be adjusted extensively with accuracy.

Moreover, since the semiconductor layer having a high mobility is disposed as the channel located on the top-gate electrode side of the first thin film transistor 1b, an on-state current of the channel is high. Furthermore, since the semiconductor layer having a low mobility is disposed as the channel located on the bottom-gate electrode side of the second thin film transistor 2b, the on-state current of the channel is low.

In the first thin film transistor 1b according to the present embodiment, the second oxide semiconductor layer 42 is disposed below the first oxide semiconductor layer 41. However, it should be noted that a different oxide semiconductor layer may be disposed instead of the second oxide semiconductor layer 42. Moreover, in the second thin film transistor 2b, the first oxide semiconductor layer 41 is disposed above the second oxide semiconductor layer 42. However, it should be similarly noted that a different oxide semiconductor layer may be disposed instead of the first oxide semiconductor layer 41.

Moreover, by the method for manufacturing the thin film transistor substrate 100b according to the present embodiment as with the manufacturing method according to Embodiment 1, each of the semiconductor layers used as the channels comprises an oxide semiconductor. With this, the mobility of the semiconductor layer can be adjusted extensively with accuracy.

Embodiment 4

The following describes a thin film transistor substrate 100c and a method for manufacturing the same according to Embodiment 4, with reference to the drawings.

The present embodiment provides a configuration example configuration different from the ones described in the above embodiments, and describes the thin film transistor substrate 100c that includes a bottom-gate TFT and a back-gate TFT.

The following mainly describes differences between the thin film transistor substrate 100c and the method for manufacturing the same according to the present embodiment and the thin film transistor substrate 100 and the method for manufacturing the same according to Embodiment 1. Thus, descriptions of the configuration and manufacturing processes identical between the present embodiment and Embodiment 1 are omitted.

4-1. Configuration of Thin Film Transistor Substrate

Figure 11:
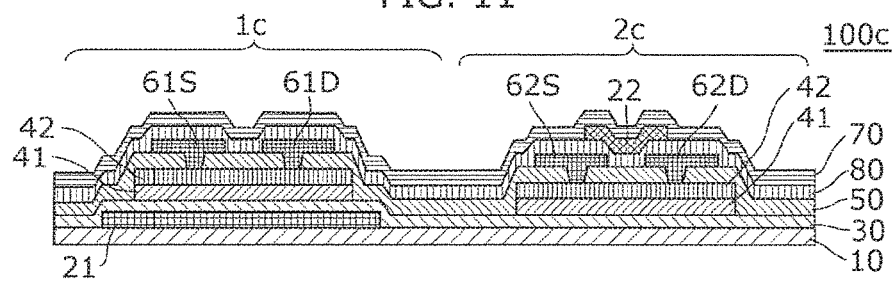
FIG. 11 is a cross-sectional view of a thin film transistor substrate according to Embodiment 4.

Firstly, the configuration of the thin film transistor substrate 100c according to the present embodiment is described, with reference to FIG. 11. FIG. 11 is a cross-sectional view of the thin film transistor substrate 100c according to the present embodiment.

As shown in FIG. 11, the thin film transistor substrate 100c includes, as with the thin film transistor substrate 100 according to Embodiment 1 above: a substrate 10; and a first thin film transistor 1c and a second thin film transistor 2c that are formed on the substrate 10. The first thin film transistor 1c is a bottom-gate TFT in which the channel-protection top-contact configuration is adopted. On the other hand, the second thin film transistor 2c is a channel-protection back-gate TFT in which the top-contact configuration is adopted.

The following mainly describes in detail the differences in the structural elements between the thin film transistor substrate 100c according to the present embodiment and the thin film transistor substrate 100 according to Embodiment 1 above.

The first thin film transistor 1c includes a first gate electrode 21, a gate insulating layer 30, a first oxide semiconductor layer 41, a channel protection layer 50, a first source electrode 61S, a first drain electrode 61D, and a protection layer 70, as with the thin film transistor 1 described above. The first thin film transistor 1c further includes a second oxide semiconductor layer 42 and an insulating layer 80. Moreover, the second thin film transistor 2c includes a second gate electrode 22, the gate insulating layer 30, the second oxide semiconductor layer 42, the channel layer 50, a second source electrode 62S, a second drain electrode 62D, and the protection layer 70, as with the thin film transistor 2 described above. The second thin film transistor 2c further includes the first oxide semiconductor layer 41 and the insulating layer 80. The present embodiment describes an example in which ZnON is used as the oxide semiconductor material as in the above-described cases of the thin film transistor substrate 100a according to Embodiment 2 and the thin film transistor substrate 100b according to Embodiment 3.

The second oxide semiconductor layer 42 in the first thin film transistor 1c is disposed on the first oxide semiconductor layer 41. Moreover, the insulating layer 80 is disposed on the entire surface of the channel protection layer 50 in a manner that the first source electrode 61S and the first drain electrode 61D are covered.

The first oxide semiconductor layer 41 in the second thin film transistor 2c is disposed below the second oxide semiconductor layer 42. Moreover, the insulating layer 80 is disposed on the entire surface of the channel protection layer 50 in a manner that the second source electrode 62S and the second drain electrode 62D are covered. Furthermore, the second gate electrode 22 is disposed on the insulating layer 80 above a space between the second source electrode 62S and the second drain electrode 62D.

The insulating layer 80 comprises an electrically insulating material, as with the insulating layer 80 according to Embodiment 3 above. For example, the insulating layer 80 is a single-layer film comprising one of, or a multilayer film comprising, a silicon oxide film, a silicon nitride film, a silicon oxynitride film, and an aluminum oxide film.

The first oxide semiconductor layer 41 and the second oxide semiconductor layer 42 have the same configurations as those in the thin film transistor substrate 100a according to Embodiment 2 and in the thin film transistor substrate 100b according to Embodiment 3.

The other structural elements included in the thin film transistor substrate 100c according to the present embodiment are the same as those included in the thin film transistor substrate 100 according to Embodiment 1.

4-2. Method for Manufacturing Thin Film Transistor Substrate

Figure 12A:
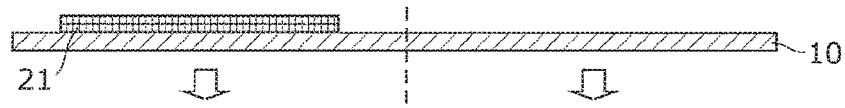
FIG. 12A is a cross-sectional view of processes in a method for manufacturing a thin film transistor substrate according to Embodiment 4.
Figure 12A:
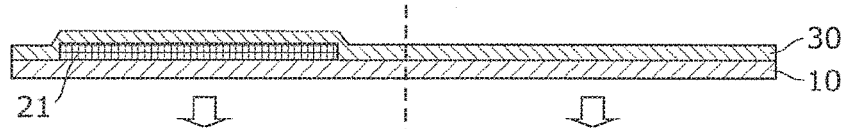
Figure 12A:
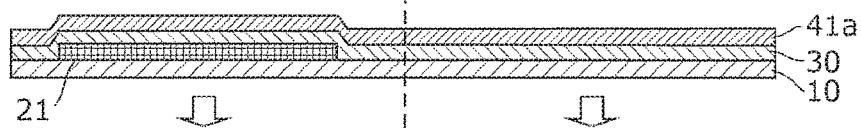
Figure 12A:
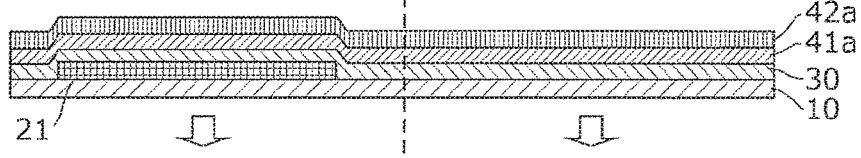
Figure 12A:
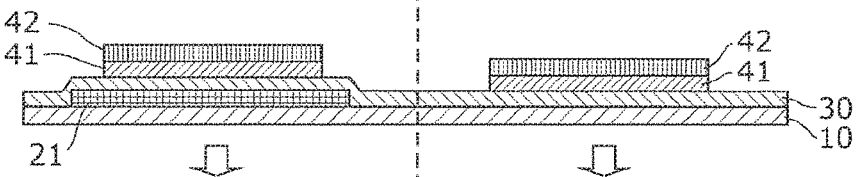
Figure 12A:
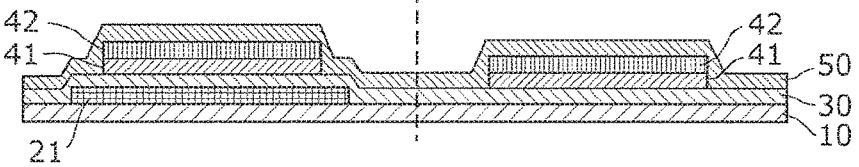
Figure 12B:
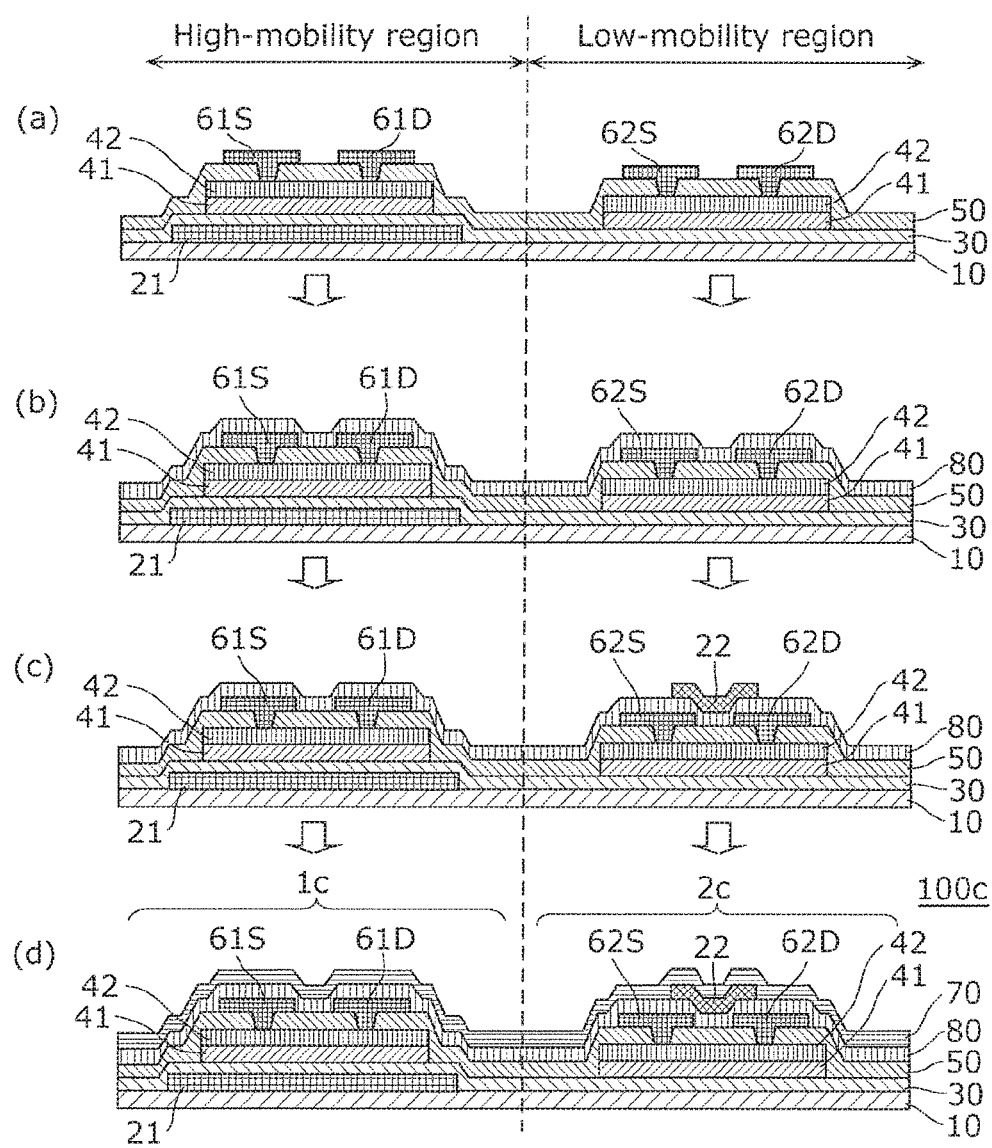
FIG. 12B is a cross-sectional view of processes in a method for manufacturing a thin film transistor substrate according to Embodiment 4.

Next, the following describes a method for manufacturing the thin film transistor substrate 100c according to the present embodiment, with reference to FIG. 12A and FIG. 12B. Each of FIG. 12A and FIG. 12B is a cross-sectional view of processes in the method for manufacturing the thin film transistor substrate 100c according to the present embodiment. Each of FIG. 12A and FIG. 12B shows, on the left-hand side of the drawing, a cross-sectional view for each of the processes performed to form the first thin film transistor 1c (a high-mobility region) in which the first oxide semiconductor layer 41 having a high mobility is used as the channel. Moreover, each of FIG. 12A and FIG. 12B shows, on the right-hand side of the drawing, a cross-sectional view for each of the processes performed to form the second thin film transistor 2c (a low-mobility region) in which the second oxide semiconductor layer 42 having a low mobility is used as the channel.

Among the layer formation processes, the same processes as those in Embodiment 1 are not described in detail.

Firstly, the substrate 10 is prepared, and the first gate electrode 21 is formed in the high-mobility region above the substrate 10, as shown in a cross-sectional view (a) of FIG. 12A.

Next, the gate insulating layer 30 is formed on the first gate electrode 21, as shown in a cross-sectional view (b) of FIG. 12A. In the present embodiment, the gate insulating layer 30 is formed on the entire surface of the substrate 10 in a manner that the first gate electrode 21 is covered.

Next, a first oxide semiconductor film 41a is formed above the substrate 10, as shown in a cross-sectional view (c) of FIG. 12A. To be more specific, the first oxide semiconductor film 41a (ZnON film) comprising an oxide semiconductor that contains ZnON as a major component is formed on the gate insulating layer 30 by the sputtering method. A specific method of film formation here is the same as the method for forming the first oxide semiconductor film 41a according to Embodiment 2 above.

Next, a second oxide semiconductor film 42a is formed above the substrate 10, as shown in a cross-sectional view (d) of FIG. 12A. To be more specific, the second oxide semiconductor film 42a (ZnON film) comprising an oxide semiconductor that contains ZnON as a major component is formed on the first oxide semiconductor film 41a by the sputtering method. A specific method of film formation here is the same as the method for forming the second oxide semiconductor film 42a according to Embodiment 2 above.

Next, the first oxide semiconductor layer 41 and the second oxide semiconductor layer 42 in predetermined shapes are formed by forming the first oxide semiconductor film 41a and the second oxide semiconductor film 42a into predetermined shapes, as shown in a cross-sectional view (e) of FIG. 12A. A specific method of formation here is the same as the method for processing the first oxide semiconductor film 41a and the second oxide semiconductor film 42a according to Embodiment 2 above.

Next, the channel protection layer 50 is formed on the second oxide semiconductor layer 42, as shown in a cross-sectional view (f) of FIG. 12A. In the present embodiment, the channel protection layer 50 is formed on the entire surface of the gate insulating layer 30 in a manner that the oxide semiconductor layers are covered.

Next, the first source electrode 61S, the first drain electrode 61D, the second source electrode 62S, and the second drain electrode 62D are formed in predetermined shapes on the channel protection layer 50, as shown in a cross-sectional view (a) of FIG. 12B. To be more specific, as described above in Embodiment 1 with reference to the cross-sectional views (b) to (d) of FIG. 2B, contact holes are formed in the channel protection layer 50, on which a conductive film is next formed in a manner that the contact holes are filled. Following this, the electrodes are formed by forming the conductive film into a predetermined shape.

Next, the insulating layer 80 is formed on the channel protection layer 50, as shown in a cross-sectional view (b) of FIG. 12B. In the present embodiment, the insulating layer 80 is formed on the entire surface of the channel protection layer 50 in a manner that the source electrodes and the drain electrodes are covered.

The insulating layer 80 is, for example, a silicon oxide film. In this case, the silicon oxide film can be formed by the plasma CVD method using silane gas ($SiH_4$) and nitrous oxide gas ($N_2O$) as introduced gas.

Next, the second gate electrode 22 is formed in the low-mobility region, as shown in a cross-sectional view (c) of FIG. 12B. To be more specific, the second gate electrode 22 is formed on the insulating layer 80 above a space between the second source electrode 62S and the second drain electrode 62D. For example, the second gate electrode 22 is formed by forming a conductive film on the insulating layer 80 by the sputtering method and then forming this conductive film into a predetermined shape by the photolithography method and the wet etching method.

Next, the protection layer 70 is formed on the insulating layer 80, as shown in a cross-sectional view (d) of FIG. 12B. In the present embodiment, the protection layer 70 is formed on the entire surface of the insulating layer 80 in a manner that the second gate electrode 22 is covered.

In this way, the thin film transistor substrate 100c shown in FIG. 11 can be manufactured.

4-3. Advantageous Effect Etc.

As described above, as in the thin film transistor substrate 100 according to Embodiment 1 above, each of the semiconductor layers used as the channels in the thin film transistor substrate 100c according to the present embodiment also comprises an oxide semiconductor. With this, the mobility of the semiconductor layer can be adjusted extensively with accuracy.

Moreover, the first thin film transistor 1c of the thin film transistor substrate 100c according to the present embodiment includes the second oxide semiconductor layer 42 disposed above the first oxide semiconductor layer 41. Furthermore, the second thin film transistor 2c of the thin film transistor substrate 100c according to the present embodiment includes the first oxide semiconductor layer 41 disposed below the second oxide semiconductor layer 42. Moreover, the first gate electrode 21 is disposed below the first oxide semiconductor layer 41, and the second gate electrode 22 is disposed above the second oxide semiconductor layer 42.

With this, since the semiconductor layer having a high mobility is disposed as the channel located on the bottom-gate electrode side of the first thin film transistor 1c according to the present embodiment, an on-state current of the channel is high. On the other hand, since the semiconductor layer having a low mobility is disposed as the channel located on the back-gate side of the second thin film transistor 2c according to the present embodiment, the on-state current of the channel is low. Furthermore, the placement of the semiconductor layer having the low mobility on the back-channel side of the first thin film transistor 1c can inhibit a leakage current from occurring on the back-channel side.

Moreover, by the method for manufacturing the thin film transistor substrate 100c according to the present embodiment as with the manufacturing method according to Embodiment 1, each of the semiconductor layers used as the channels comprises an oxide semiconductor. With this, the mobility of the semiconductor layer can be adjusted extensively with accuracy.

The method for forming the thin film transistor substrate 100c according to the present embodiment includes: a process of forming the first oxide semiconductor film 41a; a process of forming the second oxide semiconductor film 42a on the first oxide semiconductor film 41a; and a process of forming the first oxide semiconductor layer 41 and the second oxide semiconductor layer 42 both below the location in which the second gate electrode 22 is to be formed and above the first gate electrode 21, by patterning the first oxide semiconductor film 41a and the second oxide semiconductor film 42a.

With this, since the semiconductor layer having the high mobility is disposed as the channel located on the bottom-gate electrode side of the first thin film transistor 1c according to the present embodiment, the on-state current of the channel is high. On the other hand, since the semiconductor layer having the low mobility is disposed as the channel located on the back-gate side of the second thin film transistor 2c according to the present embodiment, the on-state current of the channel is low. Furthermore, the placement of the semiconductor layer having the low mobility on the back-channel side of the first thin film transistor 1c can inhibit a leakage current from occurring on the back-channel side.

Embodiment 5

Figure 13A:
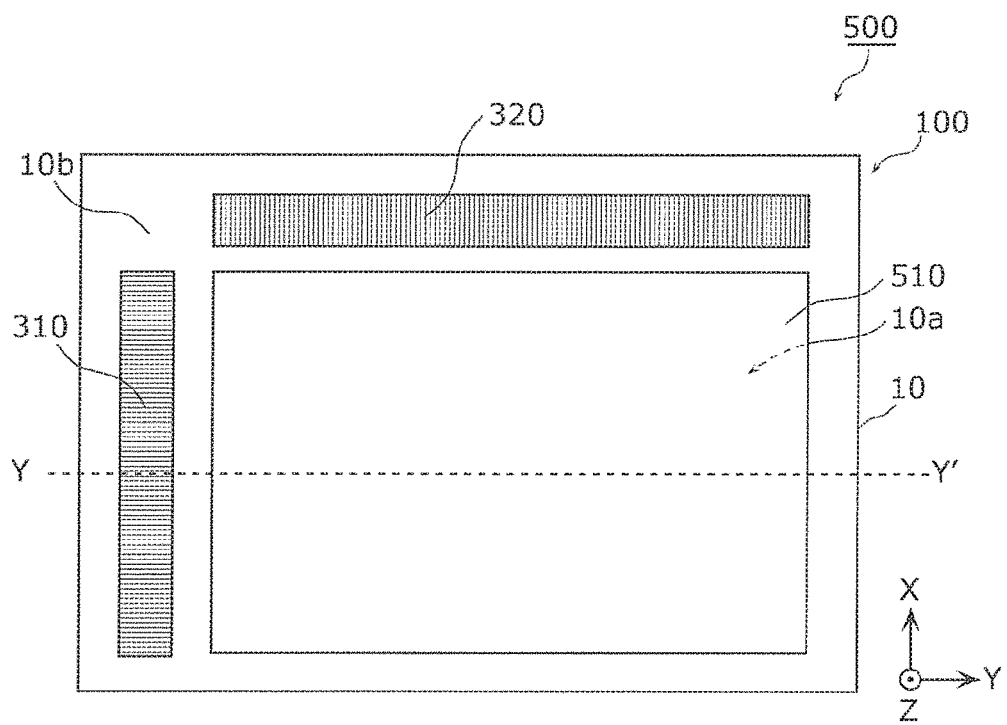
FIG. 13A is a plan view of a display panel according to Embodiment 5.
Figure 13B:
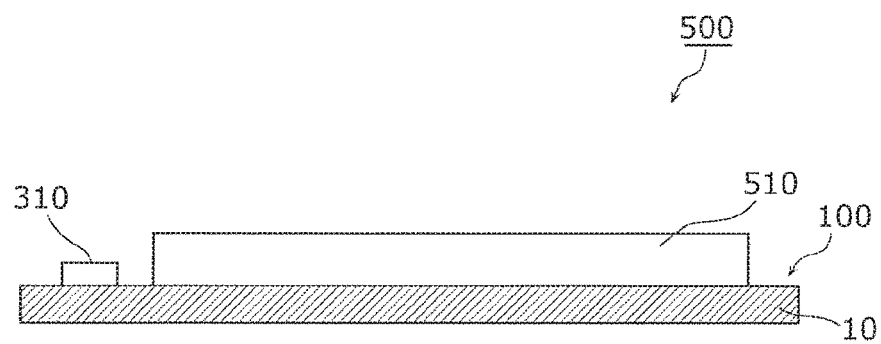
FIG. 13B is a cross-sectional view of the display panel taken along a line Y-Y' of FIG. 13A, according to Embodiment 5.

The following describes a display panel 500 according to Embodiment 5, with reference to FIG. 13A and FIG. 13B. FIG. 13A is a plan view of the display panel 500 according to Embodiment 5. FIG. 13B is a cross-sectional view of the display panel 500 taken along a line Y-Y' of FIG. 13A.

As shown in FIG. 13A and FIG. 13B, the display panel 500 according to the present embodiment includes the thin film transistor substrate according to the above-described embodiments and a display element 510 provided on the thin film transistor substrate. The present embodiment describes an example in which the thin film transistor substrate 100 according to Embodiment 1 is used.

The display element 510 is provided corresponding to an internal region (pixel region) 10a disposed on the substrate 10. As the display element 510, an organic EL display element or a liquid crystal display element may be used.

Each of a gate drive circuit 310 and a source drive circuit 320 of the thin film transistor substrate 100 is provided in a peripheral region 10b in which the display element 510 is not provided. A drive transistor that drives the display element 510 is formed in each of the gate drive circuit 310 and the source drive circuit 320. Moreover, each of pixels includes a switching transistor that selectively performs switching on the display element 51 to be driven and a drive transistor that drives, for example, a light-emitting element.

Figure 14:
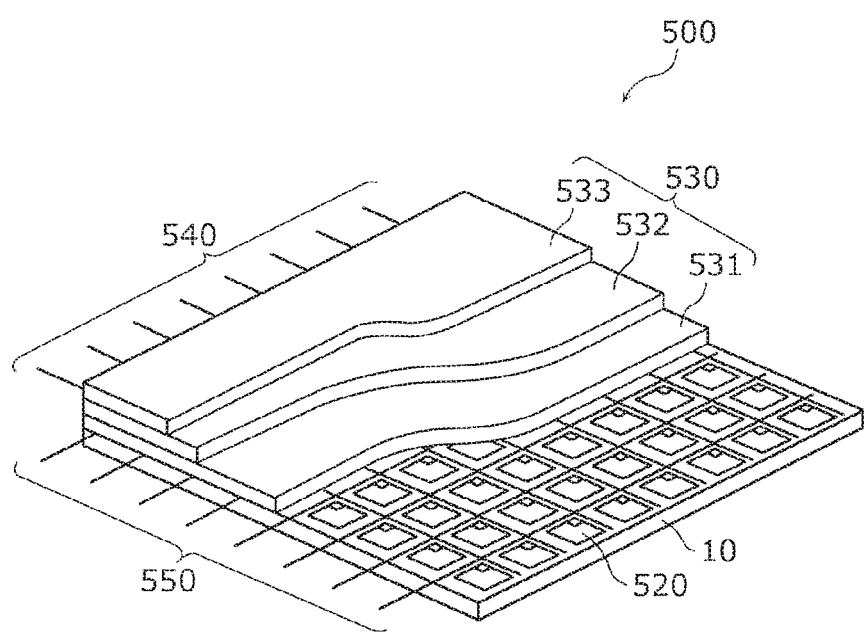
FIG. 14 is a partially-cutaway perspective view showing an organic electroluminescent (EL) display apparatus as an example of a display panel according to Embodiment 5.

FIG. 14 is a partially-cutaway perspective view showing an organic EL display apparatus as an example of the display panel 500 according to the present embodiment. The thin film transistor substrate 100 according to the present embodiment can be used as an active matrix substrate of the organic EL display apparatus.

As shown in FIG. 14, the display element 510 that is an organic EL display apparatus includes: a substrate 10, a plurality of pixels 520 arranged in a matrix on the substrate 10; an organic EL element 530 formed for each of the pixels 520; a plurality of scanning lines (gate lines) 540 formed along the direction of rows of the pixels; and a plurality of video signal lines (source lines) 550 that are orthogonal to the scanning lines and formed along the direction of columns of pixels 520. It should be noted that, although not illustrated, power lines (current supply lines) are formed in parallel with the video signal lines 550. Furthermore, the scanning lines 540 are connected to the gate drive circuit 310 shown in FIG. 13A, and the video signal lines 550 are connected to the source drive circuit 320 shown in FIG. 13A.

As shown in FIG. 14, the organic EL element 530 includes an anode 531, an organic EL layer 532, and a cathode (transparent electrode) 533 that are laminated on the substrate 10 in the stated order. It should be noted that the cathode 531 is formed for each of the pixels 520 in practice. Furthermore, the organic EL layer 532 is also formed for each of the pixels 520 and is formed by laminating layers, such as an electron transport layer, a light-emitting layer, and a hole transport layer.

Figure 15A:
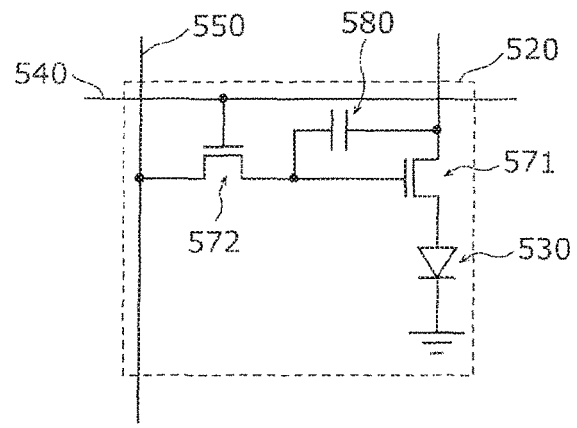
FIG. 15A is a circuit diagram showing a circuit configuration of a pixel included in the organic EL display apparatus shown in FIG. 14.

FIG. 15A is a circuit diagram showing a circuit configuration of the pixel 520 included in the organic EL display apparatus shown in FIG. 14.

As shown in FIG. 15A, the pixels 520 are partitioned by the scanning lines 540 and the video signal lines 550 that are orthogonal to each other. Each of the pixels 520 includes a drive transistor 571, a switching transistor 572, a condenser (capacitance) 580, and the organic EL element 530.

The drive transistor 571 is a transistor that drives the organic EL element 530. The drive transistor 571 includes: a gate electrode that is connected to a drain electrode of the switching transistor 572 via a contact hole; a drain electrode that is connected to the power line (not illustrated); and a source electrode that is connected to the anode of the organic EL element 530.

Moreover, the switching transistor 572 selectively performs switching on the pixel that is to be caused to emit light from among the pixels 520. In other words, the switching transistor 572 selects the pixel that is to be supplied with a video signal voltage, from among the pixels 520. The switching transistor 572 includes: a gate electrode that is connected to the scanning line 540; a source electrode that is connected to the video signal line 550; and a drain electrode that is connected to the condenser 580 and the gate electrode of the drive transistor 571.

With this configuration, when the scanning line 540 receives a gate signal and thus the switching transistor 572 is turned on, a video signal voltage supplied via the video signal line 550 is written into the condenser 580. The video signal voltage written into the condenser 580 is held for one frame period. With this held video signal voltage, the conductance of the drive transistor 571 changes in an analog fashion. Then, a drive current corresponding to a light emission gradation flows from the anode to the cathode of the organic EL element 530, and the organic EL element 530 thereby emits light.

Here, each of the drive transistors formed in the drive circuits provided in the peripheral region 10b of the substrate 10 in the display panel 500 is required to achieve high speed drive. On this account, as the drive transistor formed for each of the drive circuits, the first thin film transistor 1 is used in which the oxide semiconductor layer having a high mobility is used as the channel. Moreover, the switching transistor in an inner region 10a is required to achieve high speed drive as well in some cases. In such a case, the first thin film transistor 1 may be used as this switching transistor. Furthermore, the drive transistor that drives the organic EL element 530 in the inner region 10a on the substrate 10 is not so much required to achieve high speed drive as the aforementioned drive transistor provided in the drive circuit. On this account, as the drive transistor that drives the organic EL element 530, the second thin film transistor 2 is used in which the oxide semiconductor layer having a low mobility is used as the channel. Note that when the switching transistor in the inner region 10a is not required to achieve high speed drive, the second thin film transistor 2 may be used for all the thin film transistors provided in the inner region 10a.

Figure 15B:
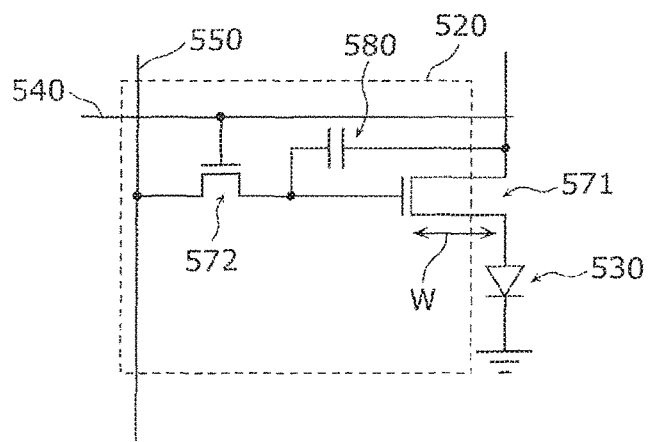
FIG. 15B is a circuit diagram showing a relationship between the mobility of a drive transistor in a pixel and the channel size.
Figure 15C:
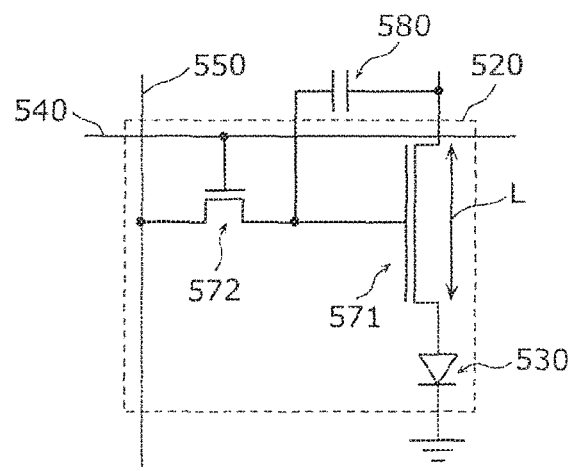
FIG. 15C is a circuit diagram showing a relationship between the mobility of a drive transistor in a pixel and the channel size.

Here, the advantageous effect of the display panel 500 according to the present embodiment is described with reference to the drawings. Each of FIG. 15B and FIG. 15C is a circuit diagram showing a relationship between the mobility of the drive transistor 571 in the pixel 520 and the channel size. In FIG. 15B and FIG. 15C, a channel width W and a channel length L of the drive transistor 571 are schematically illustrated.

Since the oxide semiconductor is used as the channel in the drive transistor 571 of the pixel 520 in the display panel 500 according to the present embodiment, the mobility can be accurately adjusted. Thus, the thin film transistor that has an appropriate mobility corresponding to the pixel size and current to be supplied to the organic EL element can be formed. On the other hand, for example, when the mobility of the semiconductor layer used for the drive transistor 571 is too low as compared with the appropriate mobility, the channel width (W) needs to be increased to supply an appropriate current to the organic EL element. In this case, the size of the drive transistor 571 in the channel width direction is increased in order to increase the channel width and, as a result, the drive transistor 571 cannot fit into the pixel 520 as shown in FIG. 15B. Moreover, when the mobility of the semiconductor layer used for the drive transistor 571 is too high as compared with the appropriate mobility, the channel length (L) needs to be increased to supply the appropriate current to the organic EL element. In this case, the size of the drive transistor 571 in the channel length direction is increased in order to increase the channel length and, as a result, the drive transistor 571 cannot fit into the pixel 520 as shown in FIG. 15C.

As described, since the oxide semiconductor is used as the channel in the display panel 500 according to the present embodiment, the mobility can be accurately adjusted. Hence, the thin film transistor that has an appropriate mobility corresponding to the pixel size and current to be supplied to the organic EL element can be formed.

Other Modifications Etc.

The thin film transistors and the methods for manufacturing the same have been described on the basis of the embodiments. However, the present disclosure is not limited to the embodiments described above.

For example, each of the embodiments above describes the example in which the two thin film transistors are provided that use, as the respective channels, the two oxide semiconductor layers different in mobility and formed on the thin film transistor substrate. However, note that three or more thin film transistors may be provided that use, as respective channels, three or more oxide semiconductor layers different in mobility.

Each of the thin film transistor substrate 100b according to Embodiment 3 and the thin film transistor substrate 100c according to Embodiment 4 includes the two semiconductor layers, that is, the first oxide semiconductor layer 41 and the second oxide semiconductor layer 42. Note that another layer comprising an oxide semiconductor may be interposed between the first oxide semiconductor layer 41 and the second oxide semiconductor layer 42. Furthermore, a structure that gradually changes in mobility may also be used between the first oxide semiconductor layer 41 and the second oxide semiconductor layer 42.

Furthermore, the organic EL display apparatus has been described as an example of the display apparatuses that include the thin film transistor substrates according to the embodiments. However, each of the thin film transistor substrates according to the embodiments and modification can also be applied to other display apparatuses, such as liquid crystal display apparatuses, or to other various kinds of electronic equipment that include thin film transistors.

In this case, the display apparatuses, such as the organic EL display apparatus (organic EL panels) and the liquid crystal display apparatuses, can be used as flat panel displays. For example, the organic EL display apparatuses can be used as display panels of various kinds of electronic equipment, such as television sets, personal computers, or cellular phones.

Other embodiments implemented through various changes and modifications conceived by a person of ordinary skill in the art or through a combination of the structural elements in different embodiments and modifications described above may be included in the scope in an aspect or aspects according to the present disclosure, unless such changes, modifications, and combination depart from the scope of the present disclosure.

INDUSTRIAL APPLICABILITY

A technology disclosed here is useful as the thin film transistor substrate and the method for manufacturing the thin film transistor substrate. Moreover, the technology can be widely used for display panels, such as organic EL display apparatuses that include thin film transistors, or for other various kinds of equipment that include thin film transistors.

The invention claimed is:

1. A display panel comprising:
a substrate; and
a first thin film transistor and a second thin film transistor that are disposed on the substrate,
wherein the first thin film transistor includes a first gate electrode and a first oxide semiconductor layer that is used as a first channel,
the second thin film transistor includes a second gate electrode and a second oxide semiconductor layer that is used as a second channel, and
the first oxide semiconductor layer comprises a first oxide semiconductor material,
the second oxide semiconductor layer comprises a second oxide semiconductor material,
a display element disposed on the substrate;
a plurality of pixels arranged in a matrix in the display element; and
a drive circuit that is disposed on the substrate and drives the display element,
wherein the first oxide semiconductor material has a higher mobility than the second oxide semiconductor material,
the first thin film transistor comprises (i) a switching transistor that is disposed in each of the plurality of pixels and selectively performs switching on the pixel that is to be caused to emit light and (ii) a drive transistor in the drive circuit, and
the second thin film transistor is a drive transistor that is disposed in each of the plurality of pixels and drives a light-emitting element in the pixel.

2. The thin film transistor substrate according to claim 1, wherein the first oxide semiconductor layer is disposed above the first gate electrode,
the first thin film transistor includes a third oxide semiconductor layer disposed on the first oxide semiconductor layer, and
the third oxide semiconductor layer comprises a third oxide semiconductor material that has a lower mobility than the first oxide semiconductor material.

3. The thin film transistor substrate according to claim 2, wherein the third oxide semiconductor material is the second oxide semiconductor material.

4. The thin film transistor substrate according to claim 1, wherein the first thin film transistor includes a fourth oxide semiconductor layer disposed below the first oxide semiconductor layer,
the second thin film transistor includes a fifth oxide semiconductor layer disposed above the second oxide semiconductor layer,
the first gate electrode is disposed above the first oxide semiconductor layer, and
the second gate electrode is disposed below the second oxide semiconductor layer.

5. The thin film transistor substrate according to claim 4, wherein the fourth oxide semiconductor layer comprises the second oxide semiconductor material, and
the fifth oxide semiconductor layer comprises the first oxide semiconductor material.

6. The thin film transistor substrate according to claim 1, wherein the first oxide semiconductor material and the second oxide semiconductor material are different from each other in element structure.

7. The thin film transistor substrate according to claim 1, wherein the first oxide semiconductor material and the second oxide semiconductor material are the same in element structure and different in element ratio.

8. The thin film transistor substrate according to claim 1, wherein the first oxide semiconductor layer has a substantially uniform thickness.

9. The thin film transistor substrate according to claim 1, wherein the second oxide semiconductor layer has a substantially uniform thickness.

10. The thin film transistor substrate according to claim 1, further comprising a channel protection layer over the first oxide semiconductor layer and over the second oxide semiconductor layer.

11. The thin film transistor substrate according to claim 10, wherein the channel protection layer is a continuous layer over both the first oxide semiconductor layer and the second oxide semiconductor layer.

12. The thin film transistor substrate according to claim 10, wherein the channel protection layer directly contacts at least one of the first oxide semiconductor layer or the second oxide semiconductor layer.

13. The thin film transistor substrate according to claim 10, further comprising:

a source electrode extending through the channel protection layer to electrically connect to the first oxide semiconductor layer; and a drain electrode extending through the channel protection layer to electrically connect to the first oxide semiconductor layer.

14. The thin film transistor substrate according to claim 10, further comprising:

a source electrode extending through the channel protection layer to electrically connect to the second oxide semiconductor layer; and a drain electrode extending through the channel protection layer to electrically connect to the second oxide semiconductor layer.

15. The thin film transistor substrate according to claim 1, wherein a top-most surface of the first oxide semiconductor layer is substantially planar across an entirety of the first oxide semiconductor layer.

* * * * *